US011950516B2

(12) United States Patent
Jespersen et al.

(10) Patent No.: US 11,950,516 B2
(45) Date of Patent: Apr. 2, 2024

(54) METHOD AND SUBSTRATE FOR PATTERNED GROWTH ON NANOSCALE STRUCTURES

(71) Applicant: University of Copenhagen, Copenhagen K (DK)

(72) Inventors: Thomas Sand Jespersen, Virum (DK); Jesper Nygård, København Ø (DK); Damon Carrad, København N (DK); Martin Bjergfelt, Frederiksberg (DK)

(73) Assignee: University of Copenhagen, Copenhagen (DK)

( * ) Notice: Subject to any disclaimer, the term of this patent is extended or adjusted under 35 U.S.C. 154(b) by 0 days.

(21) Appl. No.: 17/040,433

(22) PCT Filed: Mar. 25, 2019

(86) PCT No.: PCT/EP2019/057402
§ 371 (c)(1),
(2) Date: Sep. 22, 2020

(87) PCT Pub. No.: WO2019/180267
PCT Pub. Date: Sep. 26, 2019

(65) Prior Publication Data
US 2021/0083167 A1  Mar. 18, 2021

(30) Foreign Application Priority Data

Mar. 23, 2018 (EP) .................................... 18163624
Jul. 6, 2018 (EP) .................................... 18182192

(51) Int. Cl.
*B82Y 40/00* (2011.01)
*H10N 60/01* (2023.01)
(Continued)

(52) U.S. Cl.
CPC .............. *H10N 60/83* (2023.02); *B82Y 40/00* (2013.01); *H10N 60/0912* (2023.02);
(Continued)

(58) Field of Classification Search
CPC ..................................................... B82Y 40/00
See application file for complete search history.

(56) References Cited

U.S. PATENT DOCUMENTS

| 2004/0156108 A1 | 8/2004 | Chou et al. |
| 2011/0151190 A1 | 6/2011 | Chung et al. |

(Continued)

FOREIGN PATENT DOCUMENTS

| JP | 5243631 | 9/1993 |
| WO | 9000815 | 1/1990 |

(Continued)

OTHER PUBLICATIONS

Albrecht et al. "Exponential protection of zero modes in Majorana islands," Nature, vol. 531, pp. 206-223, Mar. 10, 2016.
(Continued)

*Primary Examiner* — Matthew L Reames
(74) *Attorney, Agent, or Firm* — Sunstein LLP

(57) ABSTRACT

The present disclosure relates to a method for manufacturing of specially designed substrates for growth of nanostructures and patterned growth on said nanostructures. The present disclosure further relates to nanostructures, in particular hybrid semiconductor nanostructures with patterned growth of superconducting material for use in quantum devices. The presently disclosed method can be utilized for in-situ manufacturing of quantum devices that have not been contaminated by ex-situ processes.

18 Claims, 17 Drawing Sheets

(51) Int. Cl.
    *H10N 60/12*   (2023.01)
    *H10N 60/80*   (2023.01)
    *H10N 60/83*   (2023.01)
    *H10N 60/85*   (2023.01)
(52) U.S. Cl.
    CPC .......... *H10N 60/12* (2023.02); *H10N 60/805* (2023.02); *H10N 60/85* (2023.02)

(56) References Cited

U.S. PATENT DOCUMENTS

| | | |
|---|---|---|
| 2013/0023121 A1 | 1/2013 | Yu et al. |
| 2015/0054135 A1 | 2/2015 | Ho et al. |

FOREIGN PATENT DOCUMENTS

| | | |
|---|---|---|
| WO | 2009029302 | 3/2009 |
| WO | 2016000836 | 1/2016 |
| WO | 2016001365 | 1/2016 |
| WO | 2016207415 | 12/2016 |
| WO | 2017023394 | 2/2017 |
| WO | 2017153388 | 9/2017 |

OTHER PUBLICATIONS

Chang et al. "Hard gap in epitaxial semiconductor-superconductor nanowires," Nature Nanotechnology, vol. 10, pp. 232-236, Mar. 2015.

Deng et al. "Majorana bound state in a coupled quantum-dot hybrid-nanowire system," Science, vol. 354, Issue 6319, pp. 1557-1562, Dec. 23, 2016.

Doll et al. "Micro-machined electron transparent alumina vacuum windows," Sensors and Actuators 87, pp. 52-59, Apr. 19, 2000.

Fülöp et al. "Wet etch methods for InAs nanowire patterning and self-aligned electrical contacts," arxiv.org, Cornell University Library, 201 Olin Library Cornell University Ithaca, NY 14853, pp. 1-9, 2016.

Gazibegovic et al. "Epitaxy of Nanowire Quantum Devices," Nature, vol. 548, pp. 434-448, Aug. 24, 2017.

Granata et al. Nano Superconducting Quantum Interference device: A powerful tool for nanoscale investigations, Physics Reports, vol. 614, pp. 1-69, 2015.

Gül et al. "Hard Superconducting Gap in InSb Nanowires," Nano Lett., vol. 17, pp. 2690-2696, 2017.

Larsen et al. "Semiconductor-Nanowire-Based Superconducting Qubit," Physical Review Letters, 115, pp. 127001-1-127001-5, Sep. 18, 2015.

Liu et al. "Observation of anomalous temperature dependence of the critical current in Pb/Sr2RuO4/Pb junctions," Physical Review B, vol. 59, No. 6, pp. 4433-4438, Feb. 1, 1999.

Lyu Rong-Jhe et al. "Downscaling Metal-Oxide Thin-Film Transistors to Sub-50 nm in an Exquisite Film-Profile Engineering Approach," IEEE Transactions on Electron Devices, IEEE Service Center, Piscataway, NJ, vol. 64, No. 3, pp. 1069-1075, Mar. 2017.

Mourik et al. "Signatures of Majorana Fermions in Hybrid Superconductor-Semiconductor Nanowire Devices," Science, vol. 336, pp. 1003-1007 May 25, 2012.

Zhang et al. "Ballistic superconductivity in semiconductor nanowires," Nature Communications, pp. 1-7, Jul. 6, 2017.

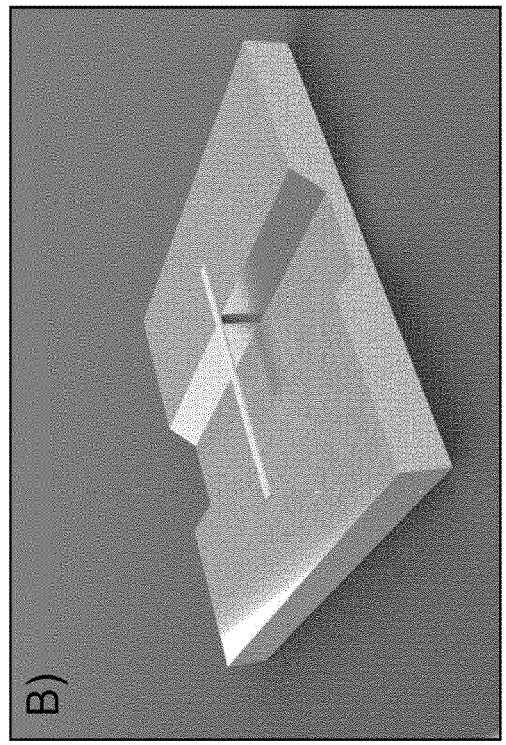
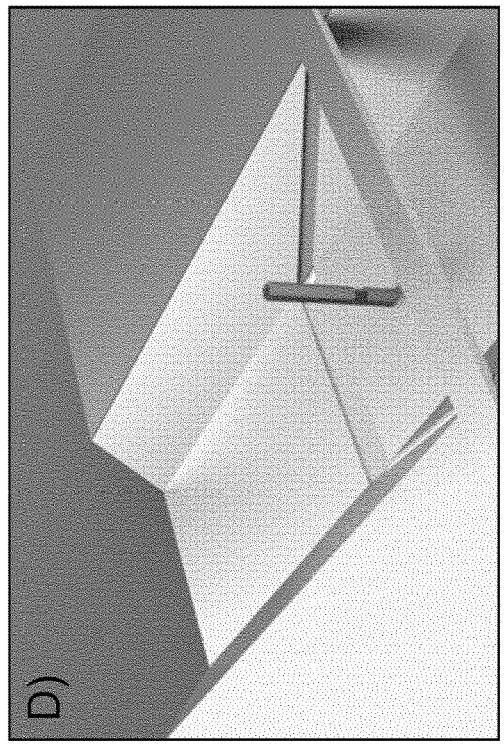
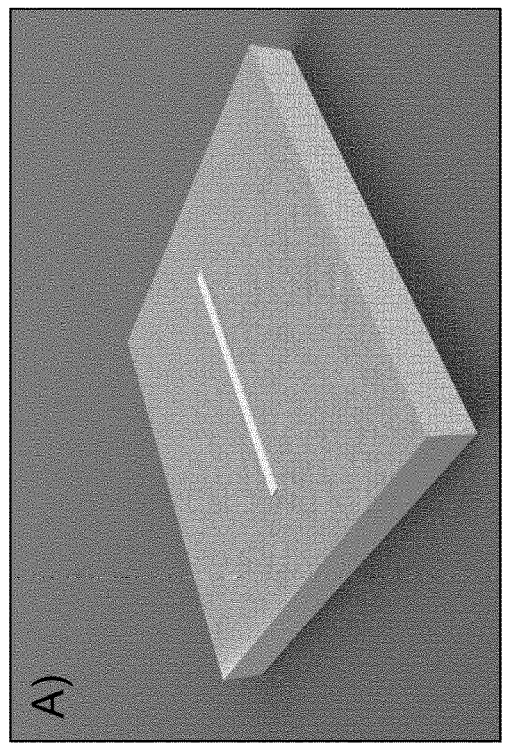
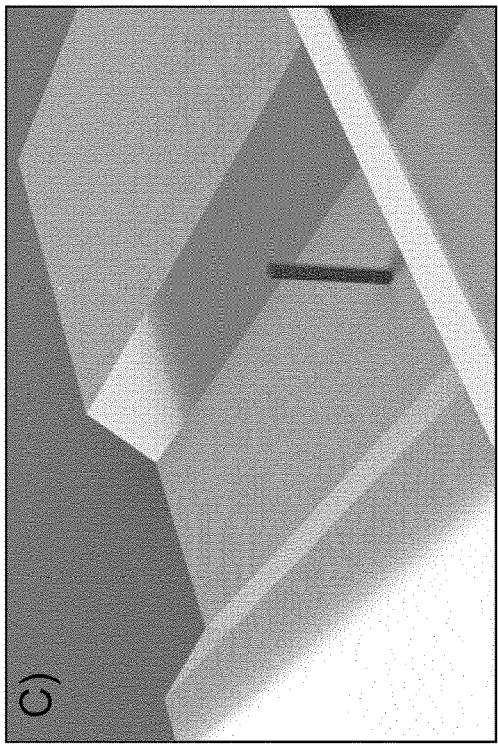
Fig. 1

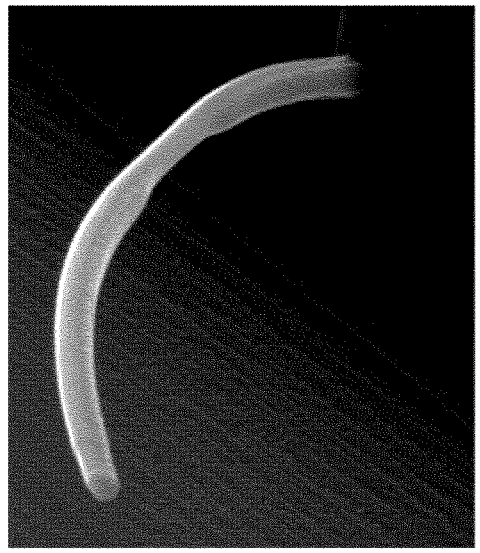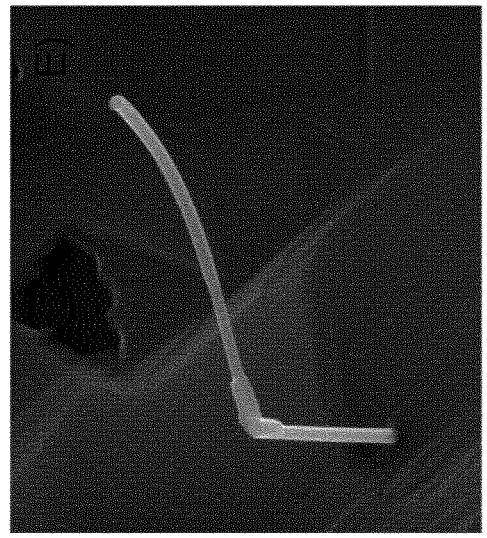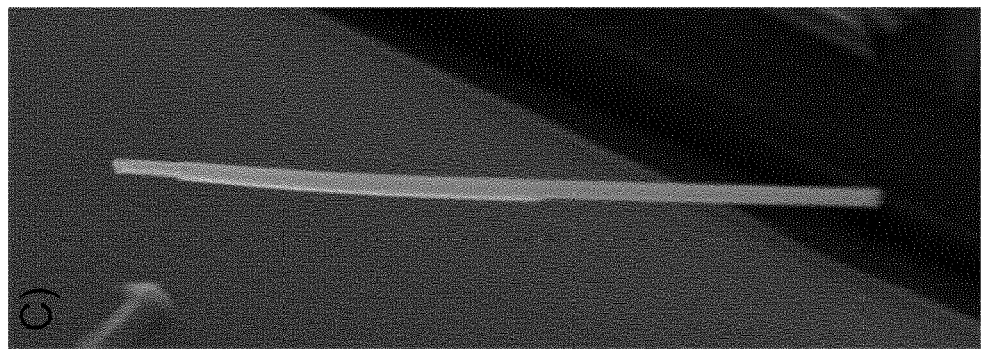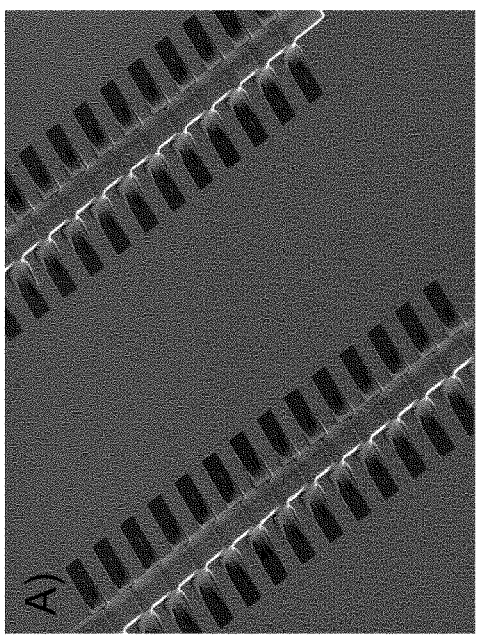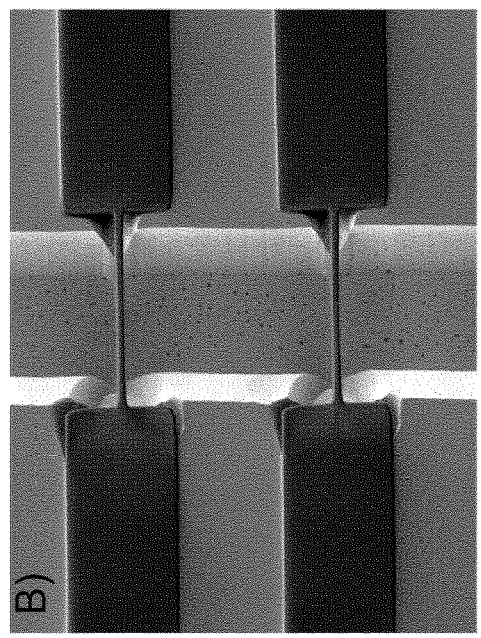
Fig. 3

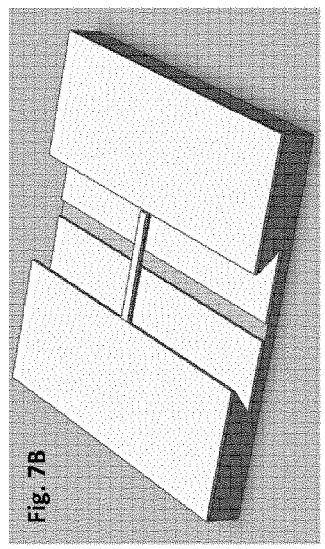
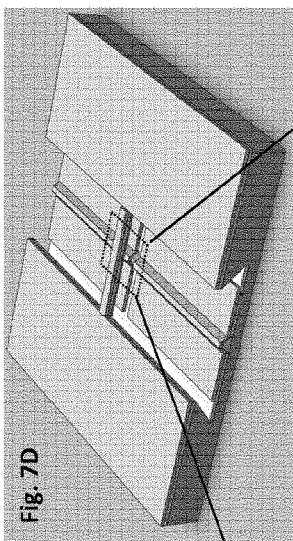
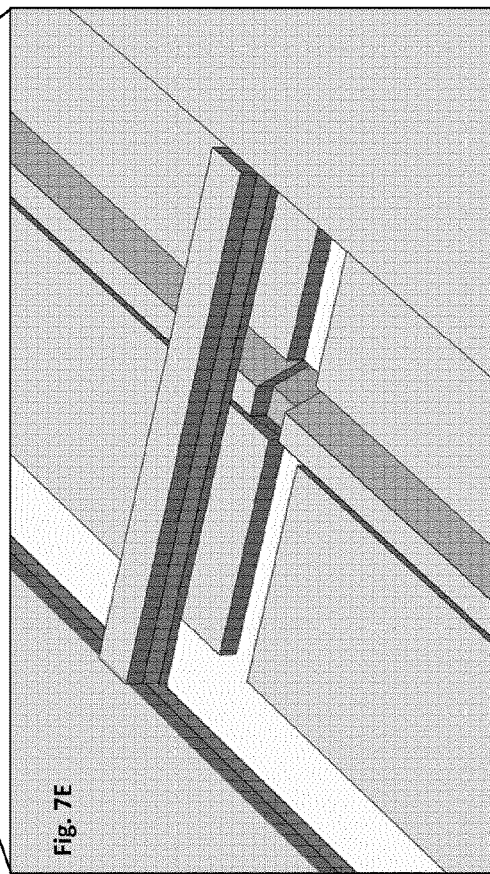
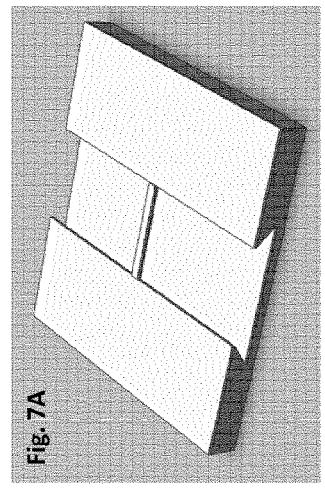
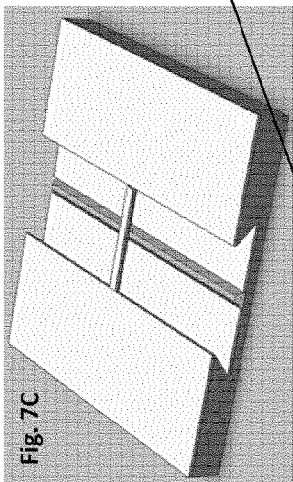

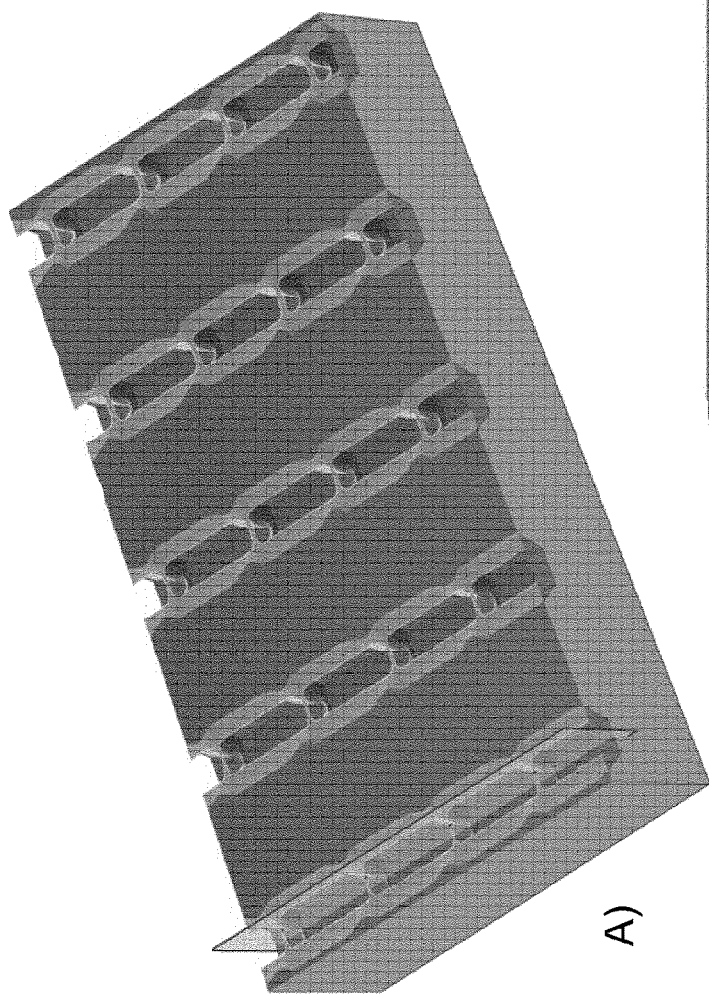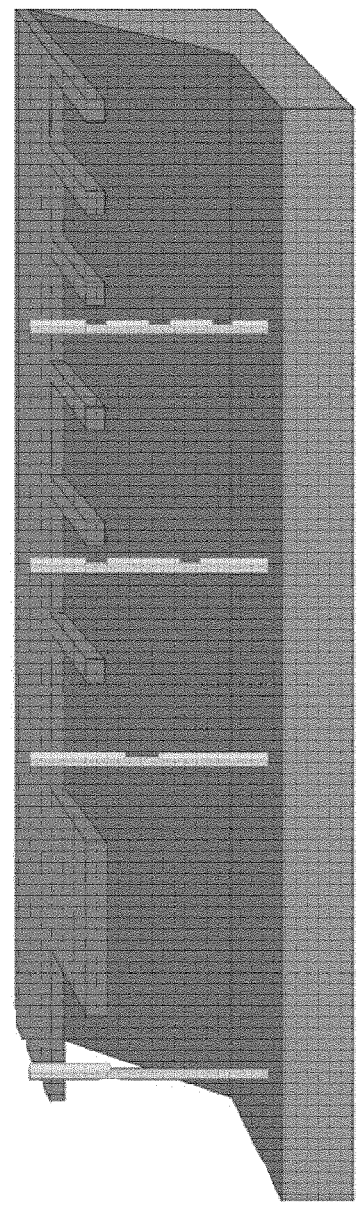
Fig. 9

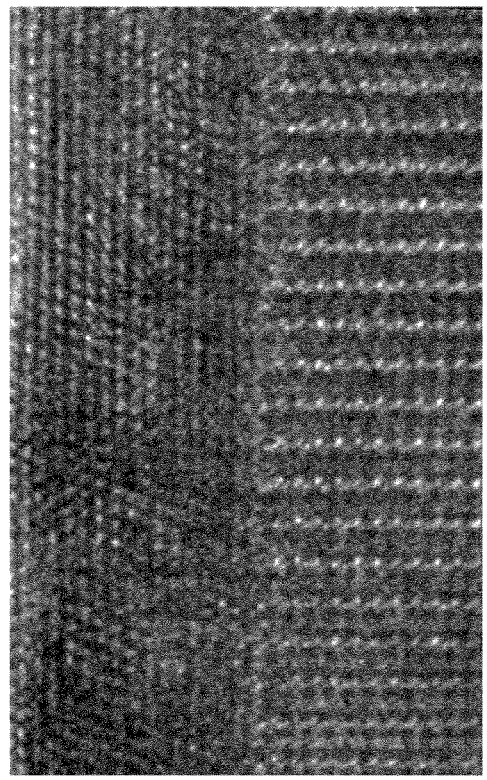
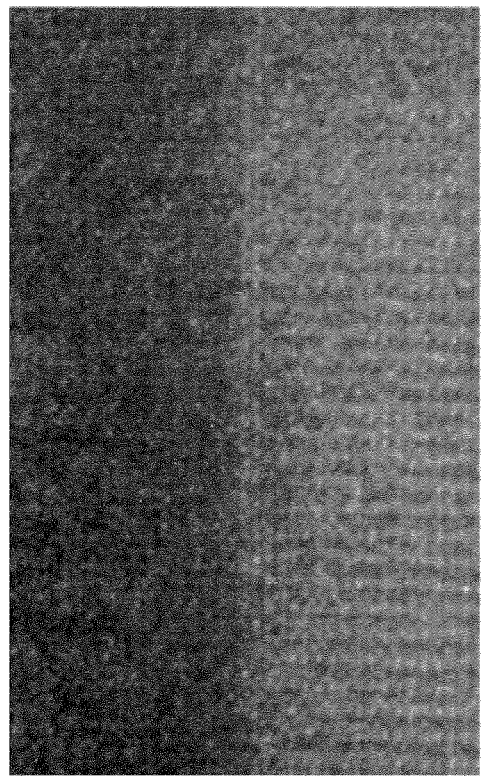
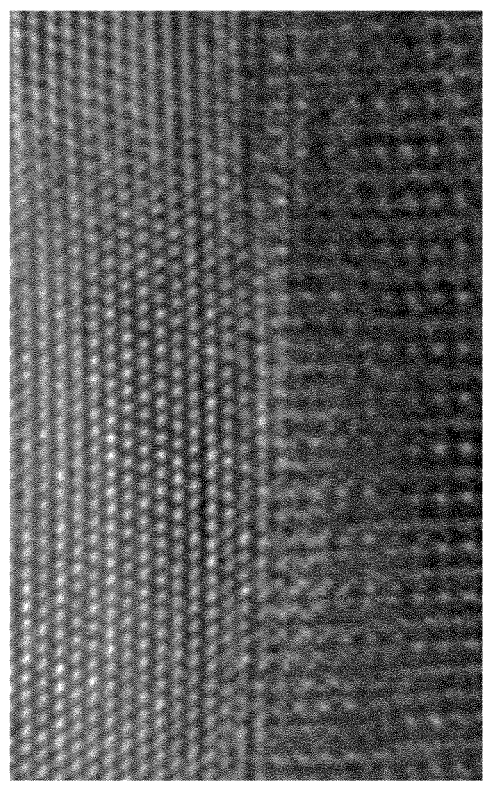
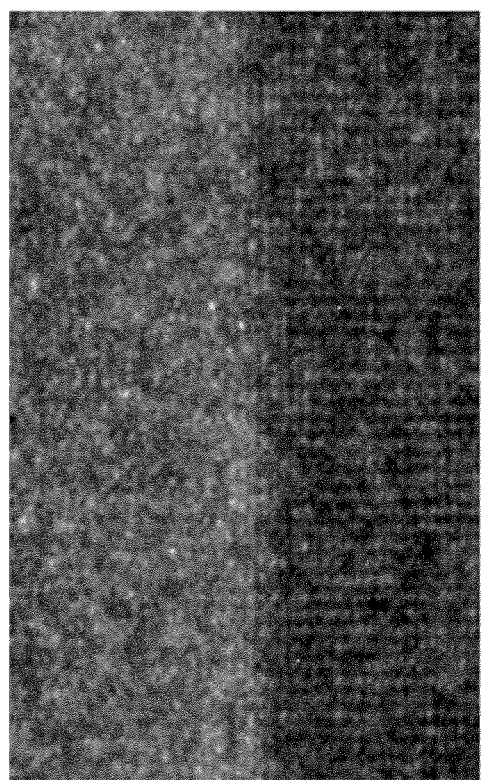
Fig. 12

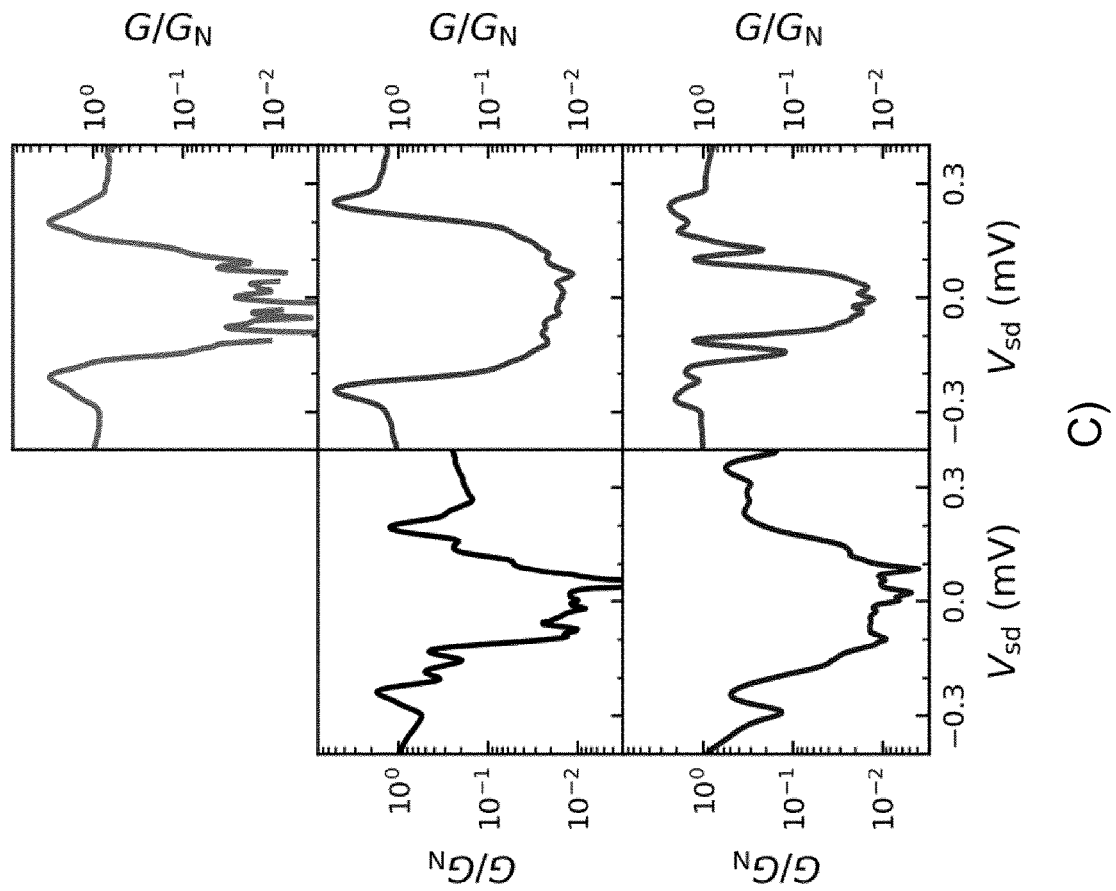
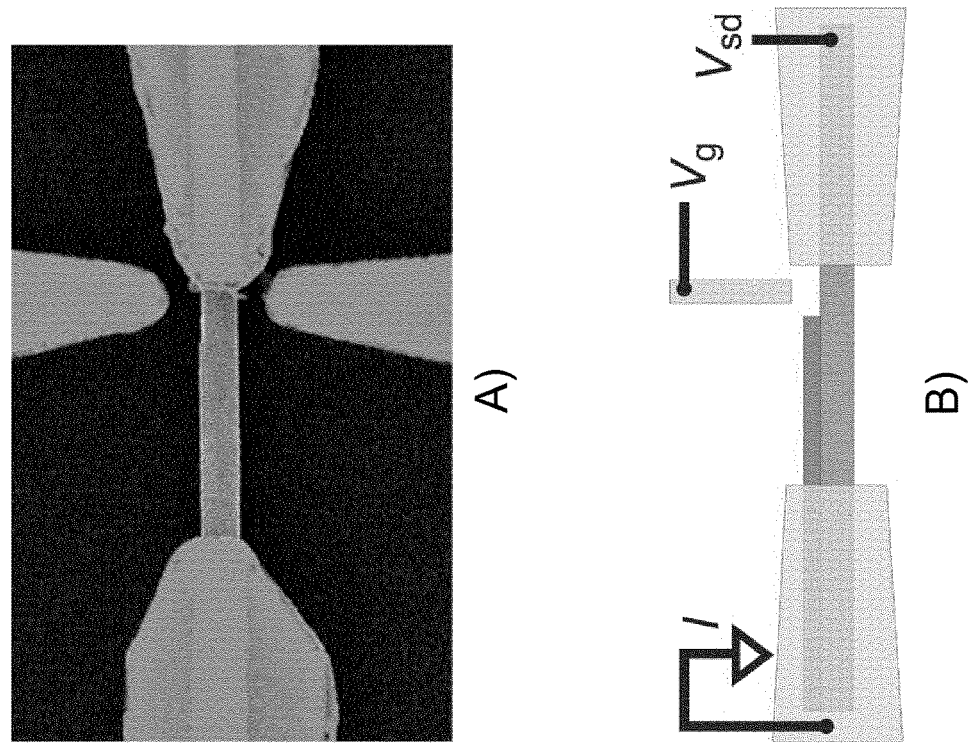
Fig 13

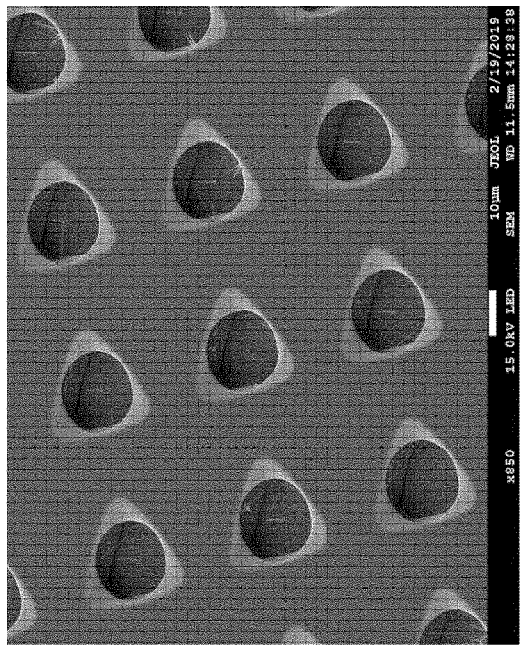
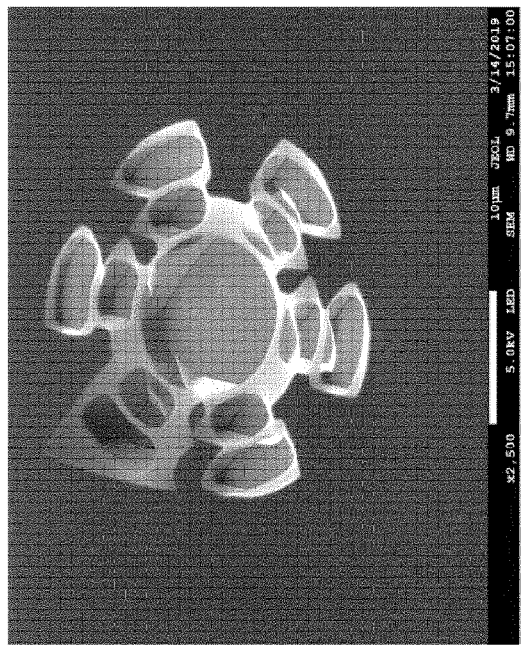
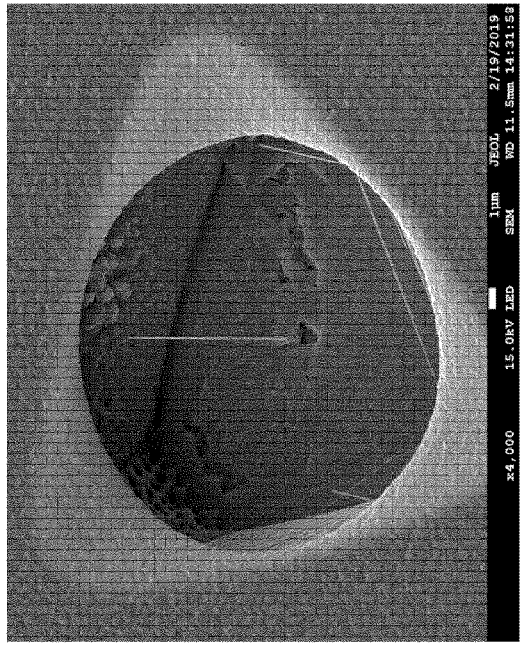
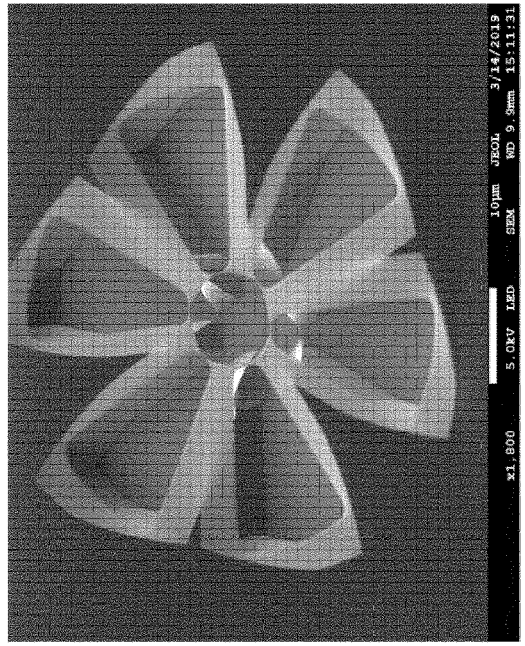
Fig. 15

METHOD AND SUBSTRATE FOR PATTERNED GROWTH ON NANOSCALE STRUCTURES

CROSS REFERENCE TO RELATED APPLICATIONS

This application is a United States national phase application from PCT/EP2019/057402, titled "METHOD AND SUBSTRATE FOR PATTERNED GROWTH ON NANOSCALE STRUCTURES," which has an international filing date of 25 Mar. 2019 and which claims the benefit of European Patent Application Nos. EP18163624.2, filed 23 Mar. 2018, and EP18182192.7, filed 6 Jul. 2018, the entire contents of each of which are hereby incorporated by reference herein, for all purposes.

The present disclosure relates to a method for manufacturing of specially designed substrates for growth of nanostructures and patterned growth on said nanostructures. The present disclosure further relates to nanostructures, in particular hybrid nanostructures with patterned growth of various layers for use in nanoscale electronic devices, such as hybrid semiconductor nanostructures with patterned growth of superconducting material for use in quantum devices. The presently disclosed method can be utilized for in-situ manufacturing of nanoscale electronic devices that have not been contaminated by ex-situ processes.

BACKGROUND OF INVENTION

Hybrid structures as a combination between semiconducting nanowires and superconductors is an emerging platform for superconducting electronics, in particular for engineering topologically protected quantum states which can be used as the basic building blocks of a quantum processor. The hybrid structures are also attractive for other superconducting quantum bits, so-called gatemons.

In order for such devices to work, the interface between the semiconductor and superconductor needs to be of high quality. WO 2016/001365 disclosed an epitaxial and atomically perfect interface between a semiconductor and a superconductor, which can be provided by growing the semiconductor and superconductor in a single grown-run, maintaining ultra-high vacuum during the whole process. The method disclosed in WO 2016/001365 has shown to reliably lead to semiconductor-superconductor hybrid structures with the crucial quality of a hard superconducting gap induced in the semiconductor density of states. For further processing into actual electrical devices, at least a part of the superconductor then typically needs to be removed by subsequent processing in order to incorporate the structures into relevant device architectures. The requirement for subsequent processing poses several challenges for the approach Fabrication recipes for selectively removing the superconductor without damaging the semiconductor exist for the case of for example aluminium, see for example Albrecht et al., Nature 531, 206 (2016) and Deng et al., Science 354, 1557 (2016). Other relevant superconductors, such as niobium-based alloys, tantalum, vanadium, $MgB_2$, each have superior properties such as higher critical magnetic fields and higher transition temperatures and have crystal structures allowing epitaxial integration with relevant semiconductors, however, no known recipes exist which allow selective removal of these metals from the semiconductors. As a consequence, these combinations can hardly be explored.

Even in the cases where process recipes do exist, processing of the superconductor will often damage the semiconductor to some degree, possibly degrading device performance and introducing device-to-device variations.

SUMMARY OF INVENTION

In general the present disclosure relates relates to 1) specially designed growth substrates with shadow structures for growth of crystalline nanostructures, and 2) in-situ growth of nanostructures and deposition of material on the nanostructures utilizing the shadow structures. The shadow structures are (vertically) raised from the growth plane of the nanostructure such that the shadow structure can create a shadow mask on the nanostructure. I.e. the nanostructures are grown on/from a specially designed growth substrate with shadow structures located on said growth substrate. With appropriate control of the size and the configuration of the shadow structure and the location of the shadow structure in relation to the nanostructure, (at least a part of) the shadow structure can be arranged to form a shadow mask on the nanostructure. During deposition of material on the nanostructure, e.g. by means of a directional beam flux, for example from a deposition source, the location of the deposition source and/or the orientation of the beam flux, and/or the location and form of the shadow structure and the nanostructure, the shadow structure can form a shadow mask on the nanostructure, such that material from the deposition source is not deposited on one or more selected surface areas on the nanostructure defined by the resulting shadow mask from the shadow structure.

Junctions made using nanowires as both the nanostructure growth object and the shadow structure have been disclosed in WO 2017/153388 and in Gazibegovic Nature, 548, 434 (2017). One purpose of the present disclosure is to improve the control of this patterned growth.

In a first aspect the present disclosure therefore relates to a method for manufacturing a substrate for growth of crystalline nanostructures, the method comprising the step of depositing one or more layers of a crystal growth compatible material, such as silicon oxide, in a predefined pattern on the surface of a crystal growth compatible substrate to create a predefined pattern of said crystal growth compatible material.

A shadow structure can then be created by etching the substrate surface around and below the deposited pattern in order to vertically offset the shadow pattern from a growth surface. For example by selectively etching the substrate surface around said pattern to provide at least one trench in the substrate surface which is at least partly suspended by at least a part of said pattern, the suspended part(s) of the pattern thereby creating one or more shadow structures which is vertically offset from the corresponding trench surface. The suspended part of the pattern can be seen to form a bridge across the corresponding trench, as exemplified in FIGS. 1, 2 and 5. Or more bridges as exemplified in FIGS. 9, 10 and 16. By having the shadow structure in a chemically stable material, etching can be provided around the shadow structure to create trenches thereby having vertically displaced shadow structure and substrate surface which corresponds to the growth plane of the deposition material. The configuration, geometry and location of the shadow structure can therefore be very precisely controlled and determined on a nano- and micron-scale.

Instead of etching below the substrate surface, a vertical offset can be provided by building vertically, for example by depositing multiple/additional layers of said crystal growth compatible material to create one or more shadow structures arising from the substrate surface, each shadow structure having an upper surface which is vertically offset, preferably by at least 1 µm, from the surface of the substrate. Hence, the shadow structure can be any solid structure vertically raised from the plane of crystal growth.

These approaches can also be combined by first building vertically by depositing additional layers of the crystal growth compatible material and then create trenches in the grown structures, see for example FIG. 2B.

The herein disclosed preprocessing of a growth substrate to create shadow structures thereon can also include a step of defining a nanostructure pattern for defining a growth pattern for one or more planar crystalline nanostructures.

The present disclosure further relates to a substrate manufactured according to the presently disclosed methods.

The present disclosure also relates to a method for utilizing these substrates with shadow structures for patterned deposition of material on nanostructures, i.e. the method comprising the step of providing a growth substrate having at least one shadow structure, wherein at least a part of said shadow structure(s) is vertically offset from a growth surface on the growth substrate, for example a growth substrate provided according to the methods disclosed above.

Subsequently at least one nanostructure can be grown on the growth substrate in the vicinity of at least one of said shadow structure(s) and such that at least initially the growth plane of the nanostructure(s) is vertically offset from at least a part of the shadow structure. At least a first layer of material can then be deposited on at least a part of the nanostructure(s) by means of at least a first deposition source.

Preferably the deposition source, the shadow structure(s) and the nanostructure(s) are arranged such that, during deposition of said first layer(s), at least a part the shadow structure(s) forms at least one shadow mask on the nanostructure(s) relative to the deposition source.

I.e. generally speaking the shadow structure in the presently disclosed approach can be designed to produce one or more small gaps in one or more of the deposited layers on the nanostructures. E.g. if a part of the shadow structure is one or more bridges as exemplified herein, the width of the one or more resulting gaps in the deposited layer(s) largely corresponds to the width of the corresponding bridge(s). I.e. the gaps in the deposited layers can be extremely well-defined and produced in-situ such that the interfaces can be kept totally clean.

At least a part of the presently disclosed methods is performed under vacuum, preferably ultra high vacuum, for example in one or more vacuum chambers. A major advantage of the presently disclosed approach is that the steps of growing at least one nanostructure and depositing the first layer—and optionally the second layer—can be performed without breaking the vacuum.

A route is therefore provided for growing hybrid nanostructures without the drawbacks mentioned above—and the presently disclosed approach is furthermore applicable to substantially any type of crystal growth compatible material.

DESCRIPTION OF DRAWINGS

FIGS. 1A-D show perspective views of one example of the presently disclosed approach of vertically displacing a shadow structure from the growth plane. In FIG. 1A a substrate of epi-ready InAs is shown with a strip of SiO defined using lithography and lift-off. In FIG. 1B a trench has been etched into the InAs substrate below the SiO structure providing a "bridge" of SiO suspending the trench. FIG. 1C shows an InAs nanowire (in close-up) grown in the trench in the vicinity of the bridge. Typical NW dimensions are diameters of 100 nm and lengths of 5-10 um. FIG. 1D illustrates the shadow mask formed in the trench and on the nanowire by the suspended SiO bridge using shallow-angle deposition angle. A shallow angle deposition of a superconducting metal covers the nanowire except at the places where the metal is shadowed by the bridge.

In FIG. 2A a trench has been etched into the InAs substrate below the SiO structure (oxide bridge) providing a "bridge" of SiO suspending the trench. The SiO pattern has been defined by means of lithography. A nanowire (NW) has been grown in the trench in the vicinity of the bridge. FIG. 2B illustrates the principle of building vertically from the substrate instead of etching into the substrate surface. Vertical building can be provided by means of oxide material. Subsequently a SiO pattern can be defined and etched below to create a trench in the oxide material thereby defining a shadow structure in the form of an oxide bridge as illustrated in FIG. 2B. Likewise a NW can be grown in the trench. FIG. 2C illustrates in close-up a nanowire in a trench (not shown) in the vicinity of a shadow structure in the form of an oxide bridge. FIG. 2C illustrates how a S-NW-N junction can be created by having different angles of deposition relative to the shadow structure.

FIGS. 3A-E show low magnification scanning electron micrographs. FIG. 3A shows an overview of two etched trenches with a plurality of bridges suspending a trench. FIG. 3B shows a close-up of two of these bridges suspending a trench. FIG. 3C shows a close-up of a nanowire which is half-covered by a superconducting metal. FIG. 3D shows an example of a S-NW-S junction made by shadowing from a narrow bridge. The bending seen in FIG. 3D is a result of the strain induced by the metal and the effect is artificially enhanced by the viewing angle. FIG. 3E shows an example of a junction created on a kinked nanowire where the growth was forced to be parallel to the substrate after a segment of convention vertical growth. The kinked nanowires may be a way of producing hard-gap hybrids with branches required in some schemes of topological information processing.

FIG. 4A shows an image of the device that has been realized using the presently disclosed method. A half-shell facet layer of superconducting Tantalum was grown on an InAs nanowire. A shadow structure provided a gap in the Tantalum layer allowing contacting of the semiconductor. FIG. 4B shows a schematic of the device where two side-gates are used to locally deplete the semiconductor and allow for a tunnel measurement of the density of states of the hybrid semiconductor/superconductor nanostructure. FIG. 4C shows the tunnel conductance as a function of applied bias on normal (top) and log scale (bottom), respectively. As seen from the graphs, the hard gap is clearly visible at low temperature, i.e. below 20 mK.

FIGS. 7A-E shows a schematic illustration of the use of electron and/or optically transparent material for the shadow structures. This is a powerful tool in combination with planar nanostructures. A shadow structure is defined in FIG. 7A on a substrate consisting of a bridge over a trench. A thin layer of masking oxide has been deposited on the entire substrate. The semiconductor will not grow on this oxide layer but the shadow structure is transparent to conventional lithography. To define a planar nanostructure growth pattern conventional lithography and etching is used to remove the masking oxide along a narrow region—including an area below the bridge of the shadow structure as shown in FIG. 7B, such that a longitudinal growth pattern is defined which extends substantially perpendicular to the longitudinal shadow structure. This growth pattern opens up to the substrate, where semiconductor material can grow. In FIG. 7C a planar semiconductor nanostructure is grown, but only in the exposed area defined by the growth pattern. The growth relies on diffusion on the substrate and is not affected by the presence of the shadow structure. In FIG. 7D a metal layer is deposited vertically at low temperature. Here diffusion is negligible, i.e. non-diffusive deposition, and the shadow structure defines a gap in the superconductor as emphasized in the zoom shown in panel in FIG. 7E.

In FIG. 8A two broad strips have been etched in the oxide layer exposing the semiconductor underneath. In FIG. 8B the exposed semiconductor strips have been etched until a void is created at the places of the semiconductor strips resulting in an oxide bridge across the void. In FIG. 8C a nanowire has been grown in the void near the bridge. In FIG. 8D material deposition at a predefined angle results in shadow masking of the nanowire caused by the oxide bridge across the void.

FIGS. 9A-B illustrate the mass production capability of the presently disclosed approach. FIG. 9A is a combined scanning electron micrograph (SEM) and schematic showing, in perspective view, series of bridges in series of voids. FIG. 9B is a schematic of the plane cut illustrated to the left in FIG. 9A. Four nanowires, e.g. semiconductor nanowires, are illustrated and they have been grown from the bottom, each nanowire grown near an oxide bridge. Material deposition, e.g. with a superconducting material, from the right in FIG. 9B has resulted in the four nanowires having different deposition patterns as a result of the different bridge geometries. The left most bridge is a wide bridge resulting in a half-shadowed nanowire giving a 'normal-superconductor' (NS) geometry. A single bridge (no. 2 nanowire from the left) produces a 'superconductor-normal-superconductor' SNS pattern for use in e.g. a tunable Josephson junction. Two bridges give a superconducting island as seen with no. 3 nanowire from the left. Three bridges give two superconducting islands as illustrated on the right-most nanowire.

FIG. 10A shows the wide bridge and the resulting NS nanowire with superconductor deposited on the upper part. The NS geometry is also achievable by simply etching a trench without any bridges. FIG. 10B is a single bridge providing a SNS nanowire. FIG. 10C shows two bridges and the resulting nanowire with a superconducting island, i.e. SNSNS. FIG. 10D shows three bridges and the resulting SNSNSNS nanowire.

FIG. 11 is a scanning electron micrograph (SEM) showing series of voids, each series of voids having series of bridges, in total forming a large array of voids and bridges prior nanowire growth. After nanowire growth near each set of bridges in each void, each nanowire will be shadowed by a set of three bridges during superconductor deposition, yielding two superconducting islands as shows in FIG. 10D and to the right in FIG. 9B. All though not visible in FIG. 11, width and spacing of the bridges have been intentionally varied across the rows of bridges to give a spread of island sizes and separations. The scanning electron micrograph was acquired with 170 times magnification at 5 kV.

FIGS. 12A-D are SEMS of the crystalline interfaces between InAs nanowire and deposited material for four different deposition materials using the presently disclosed shadow deposition approach. The InAs nanowires are crystalline with low stacking fault density. The structure of the deposited material depends on the ability to form a match to InAs. FIG. 12A shows InAs/Al and FIG. 12B shows InAs/In and the metals are epitaxially matched to the InAs as also seen in the figures. But deposited films may also be amorphous or polycrystalline, as seen in FIG. 12C with InAs/niobium FIG. 12D InAs/tantalum. The presently disclosed approach has also been demonstrated with vanadium films on InAs nanowires (not shown).

FIGS. 13A-C show that the presently disclosed shadow deposition approach indeed can provide a superconducting hard gap. FIG. 13A is a scanning electron micrograph and FIG. 13B is a corresponding illustration of a tunnel-probe device used for measuring the properties of the gap of a nanowire, which has been partly covered by Al using the presently disclosed shadow deposition approach providing NS geometry. The Al is epitaxial matched to the InAs nanowire, which is the straight horizontal section in FIGS. 13A-B. Tl/Au contacts in each end of the nanowire are used to supply $V_{sd}$ and measure conductance $G=dI/dV_{sd}$. The two other electrodes (from the top and from the bottom in FIG. 13A) supply gate voltage $V_g$ that tunes the electrostatic tunnel barrier formed by the shadowed part of the nanowire, i.e. the exposed section below the Vg electrode in FIG. 13B. FIG. 13C shows tunneling conductance for five separate Al-coated devices like the one shown in FIGS. 13A-B. In FIG. 13C data has been normalised to the 'normal state' conductance, $G_N$ at $V_{sd}$=−0.4 mV. The superconducting gap gives rise to peaks at D~+/−0.25 mV. Additional peaks below the gap are associated with bound states arising from the hybrid superconductor/semiconductor interface, confirming induced superconductivity into InAs. Conductance below the superconducting gap for all devices was reduced by 50-100×, characteristic of a clean interface between InAs and Al.

FIG. 14A is a SEM Scanning electron micrograph of the device used for measurements. The nanowire is InAs which been shadowed to produce a NS geometry with tantalum as the superconductor. FIGS. 14B shows a schematic of one device used for tunnel spectroscopy, i.e. for characterizing the gap, corresponding to the device in FIG. 13, and FIG. 14E shows a schematic of another device used for measuring the properties of the superconductor itself. FIGS. 14C-D show the actual induced gap from tantalum into InAs, i.e. the gap is also a hard gap despite the amorphous morphology, cf. FIG. 12D. I.e. retaining a clean interface between growth and deposition can be a key aspect of obtaining a hard gap. The device illustrated in FIG. 14E is used to measure the properties of the superconductor itself via a four-point probe method. An applied current I generates a voltage drop V, such that the resistance of the superconductor, $R=V/I$, can be accurately measured. In FIG. 14F the resistance is seen to drop to zero below a critical temperature of approx. 0.6 K. As seen in FIG. 14G applying a perpendicular magnetic field when device temperature is approx. 20 mK destroys the superconducting state above a critical field of approx. 3.5 T. This critical field is much higher than that of aluminium.

FIGS. 15A-D show how uniform coating on all nanowire facets can be obtained by circularly symmetric shadow masks and rotation of the substrate during deposition to obtain a complete 'full shell' with the desired geometry. FIG. 15A shows a top perspective SEM (4000× magnification) of a circular void in a substrate with a nanowire in the center of the void. Deposition from an angle during deposition will provide a full shell NS geometry where all facets on the top section of the nanowire are coated and the bottom section is uncoated. FIG. 15B is a top perspective SEM (850× magnification) showing a plurality of the geometries in FIG. 15A. FIG. 15C shows a top perspective SEM (1800× magnification) of a circular symmetric void and bridge pattern in a substrate where six radial bridge structures are provided to surround a hexagonal nanowire in the center. Josephson junctions can be achieved with the pattern illustrated in FIG. 15C because superconductor metal can be deposited along the six directions determined by the bridge pattern, e.g. by rotating the substrate during deposition, and the side facets of the hexagonal nanowire. Correspondingly FIG. 15D shows a top perspective SEM (2500× magnification) of a circular symmetric void and bridge pattern in a substrate where 12 radial bridge structures, two layer of six in each, are provided to surround a hexagonal nanowire in the center. The double bridge structure in each of the six radial directions can achieve a nanowire with a superconducting island on all six facets.

As illustrated in FIG. 16 one example is to have different number of bridges on either side of the nanowire and for example use the second coating (i.e. second deposition) as contacts to probe the local density of states along the nanowire, and the effect of the first coating (i.e. first deposition), e.g. a superconductor. Four nanowires are seen in FIG. 16. The second nanowire from the left has a single bridge to the left and three bridges to the right, i.e. deposition from the left provides another shadow pattern than deposition from the right.

In FIG. 17A is shown two examples of a nanowire with superconductor on the full length (coating 1) and Coating 2 is used to probe the density of states (DoS) at different locations along the full length of the superconductor coating. FIG. 17B illustrates that the DoS under a superconductor (Coating 1) can be compared directly with the DoS in a normal nanowire, on the same device. FIG. 17C illustrates measurement of the DoS at different location in two gate-tunable Josephson junctions. FIG. 17D illustrates measurement of the DoS in two nanowires with superconducting islands of different lengths.

DETAILED DESCRIPTION OF THE INVENTION

Figure 2A:
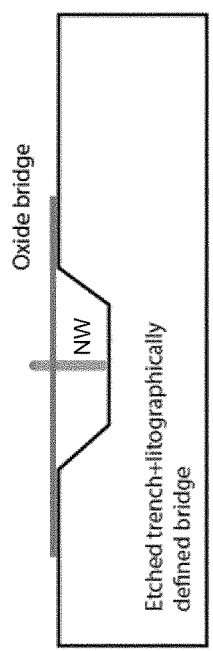
FIGS. 2A-C show cross-sectionals views of one example of the presently disclosed approach of vertically displacing a shadow structure from the growth plane.
Figure 2B:
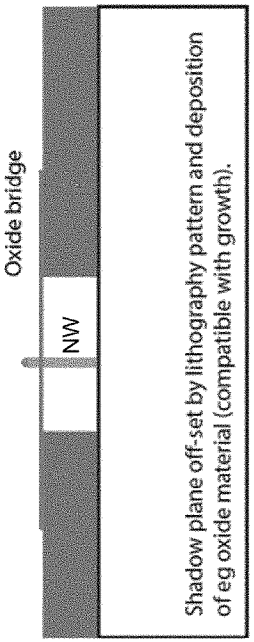

The tuneable qubit disclosed in WO 2016/000836 was based on a discovery presented in WO 2016/001365 wherein a nanoscale device (or nanometer scale) comprising an elongated crystalline semiconductor nanostructure, such as a nanowire (crystal) or nanowhisker (crystal) or nanorod (crystal), with epitaxial interfaces between the semiconductor and a metal was disclosed. WO 2016/001365 demonstrated the realization of an almost perfect (epitaxial) interface between a semiconductor and a superconductor in the form of a metal, in particular a hybrid nanostructure with InAs and Al. WO 2016/000836 and WO 2016/001365 are incorporated herein by reference in their entirety.

The present disclosure does not only relate to vertically grown and/or bottom-up grown nanostructures, such as nanowires, but to any nanostructure where a material needs to be selectively deposited, e.g. in a predefined pattern. I.e. the present disclosure also relates to nanostructures grown by planar growth, for example by means of selective area growth. This is exemplified in FIG. 5 where a shadow mask is provided on a planar nanostructure by means of a shadow nanostructure which is vertically displaced from the planar nanostructure. It is also exemplified in FIG. 7 where a shadow mask is located directly above a planar nanostructure.

The patterns as disclosed herein can be defined by means various methods known in the art, for example by means of lithography, such as optical lithography or e-beam lithography. Shadow structures can then realized by means of for example etching, e.g. wet etch and/or dry etch, or various liftoff techniques known in the art. Alternatively the shadow structures can be defined first and the planar nanostructure growth pattern can be defined thereafter. By making the shadow mask in a material that is transparent to optical lithography and/or electron beam lithography, a growth pattern can be defined that extend directly below a shadow mask, as exemplified in FIG. 7. Examples of such lithography transparent materials can be found in T. Doll, M. Hochberg, D. Barsic, A. Scherer "*Micro-machined electron transparent alumina vacuum windows*" Sensors and Actuators A, 87,1, 52-59 (2000). The degree of for example electron transparency of a material depends on the material, and energy of the electrons. Materials such as Silicon Oxide or Silicon Nitride are effectively transparent when thinner than ~50-100 nm. Membranes of these materials are routinely used for support-grids in Transmission Electron Microscopes applications. Hence, Silicon Oxide or Silicon Nitride can be used to create the presently disclosed shadow structures.

In the shadow structure approach disclosed in WO 2017/153388 the shadow structures in the form of neighboring nanowires were employed as part of the growth process, i.e. all process steps were provided in-situ. A major advantage of the presently disclosed approach is that the provision of a specially designed growth substrate with shadow structures thereon, can be provided beforehand, i.e. ex-situ, whereas the important process steps of growing the nanostructure and creating one or more patterned layers thereon, can still be provided in-situ. At least a part of these processes are typically provided under vacuum, and in particular the growth of the nanostructure(s) and the subsequent deposition of one or more patterned layers can be provided without breaking the vacuum. The presently disclosed methods employing shadow structures are therefore compatible with the normal in-situ crystal growth environment. The result is that almost many designs of nanostructure devices can be fabricated in situ under vacuum conditions, for example metal/superconductor-semiconductor wires can be designed to have metal/superconductor deposited at specific segments of the wire. This approaches disclosed herein thereby eliminate the need for delicate processing in the fabrication of e.g. nanowire devices.

The presently disclosed method is furthermore flexible enough to be compatible with all currently relevant geometries for topological processors. The present approach also allows different materials at different segments, for example allowing (normal metal)-nanowire-(superconductor) structures to be directly grown. The method is highly relevant for future topological quantum processors and other applications in gate-tunable superconducting electronics, but is also applicable within applications of semiconductor nanowires where the quality and reproducibility of electrical contacts play an important role. The presently disclosed approach provides an important step towards up-scaling hybrid nanowire devices for applications as it will potentially reduce the device variation that inherently exists in hybrid materials like these.

The present approach is relevant for all nanowire based electrical devices because handling of such delicate devices can be extremely difficult. The present approach eliminates some of most problematic and unpredictable steps from the fabrication of nanowire-based topological devices. An example of an S-NW-S junction is disclosed in WO 2016/000836 where it is used as a Josephson junction. The presently disclosed approach is directly applicable there, i.e. using a shadow structure to provide a gap in the superconducting facet layer on a semiconductor nanostructure. In this case the first facet layer is provided in a superconducting material which is deposited on the nanostructure, a small gap in the superconducting material is provided by the shadow mask formed by the shadow structure. This small gap may consequently constitute a Josephson junction manufactured in-situ that will have the highest possible quality because it is untouched by any top-down ex-situ process, i.e. it is 100% clean. If the nanostructure is furthermore a semiconductor and the superconductor first facet layer is deposited to provide an epitaxial match between the semiconductor and the superconductor, a semiconductor weak link is provided to form a semiconductor based Josephson junction manufactured in-situ that will have the highest possible quality, i.e. it is 100% clean. Using the terms of the disclosure in WO 2016/000836 a Josephson junction can be provided by means of the presently disclosed method. The Josephson junction comprising an elongated hybrid nanostructure comprising superconductor and semiconductor materials and a weak link, wherein the weak link is formed by a semiconductor segment of the elongated hybrid nanostructure wherein the superconductor material has been removed by means of the shadow structure to provide a semiconductor weak link.

A hard superconducting gap has also been demonstrated in InSb semiconductor nanowires with an NbTiN superconducting layer (GuI et al., Nano Lett. (2017) 2690-2696 and Zhang et al., Nature Communications (2017), 10.1038/ncomms16025). In that case there was no epitaxial interface between the semiconductor and the superconductor, but a hard gap was provided due to an improved homogeneous interface between the semiconductor and the superconductor and a barrier-free electrical contact. The presently disclosed approach where growth and subsequent patterned deposition can be provided without breaking the vacuum helps to ensure a very clean and barrier-free interface.

The method for patterned deposition of material on nanostructures as disclosed herein may further comprise the step of depositing at least a second layer of material on at least a part of the nanostructure(s) by means of at least a second deposition source. Advantageously the second deposition source, the shadow structure(s) and the nanostructure(s) can then be arranged such that, during deposition of said second layer(s), at least a part the shadow structure(s) forms at least one shadow mask on the nanostructure(s) relative to the second deposition source.

In the preferred embodiment the nanostructures are elongated nanostructures, such as elongated crystalline nanostructures, such as elongated crystalline semiconductor nanostructures, i.e. with one dimension of the nanostructures being considerable larger than the other two dimensions. The nanostructures may also be substantially one-dimensional, like a wire, e.g. in the form of nanowires.

The at least first and/or second layer can be any kind of crystal growth compatible material, for example selected from the group of semiconductors, superconductors, metals, magnetic materials, oxides and dielectrics. The nanostructures may be provided by bottom-up growth and/or planar growth and are preferably selected from the group of nanowires (crystals) or nanowhiskers (crystal) or nanorods (crystals).

The nanostructures may comprise a plurality of substantially plane side facets, which is typical for nanowires. Further, the growth positions of nanostructures on the substrate can be determined by means of one or more catalyst patterns, such as defined on the surface of the substrate, preferably by means of lithography. Growth from random locations can also be provided if growth positions are not defined by a catalyst pattern. For bottom-up growth the growth direction of at least a part of the nanostructure(s) can be kinked during growth.

Figure 5B:
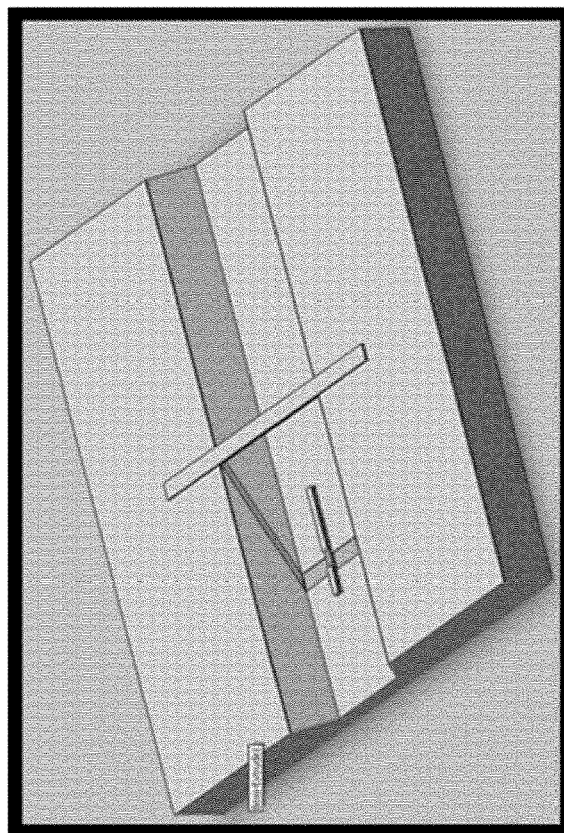
FIGS. 5A-B illustrates the shadow-approach for patterning metallic layers on planar nanostructures grown in a trench with a suspending bridge as shadow structure. Planar structures can be provided by a planar growth process, such as selective area growth, rather than vertical nanostructures, such as nanowires, that are typically provided by bottom-up growth.
Figure 5A:
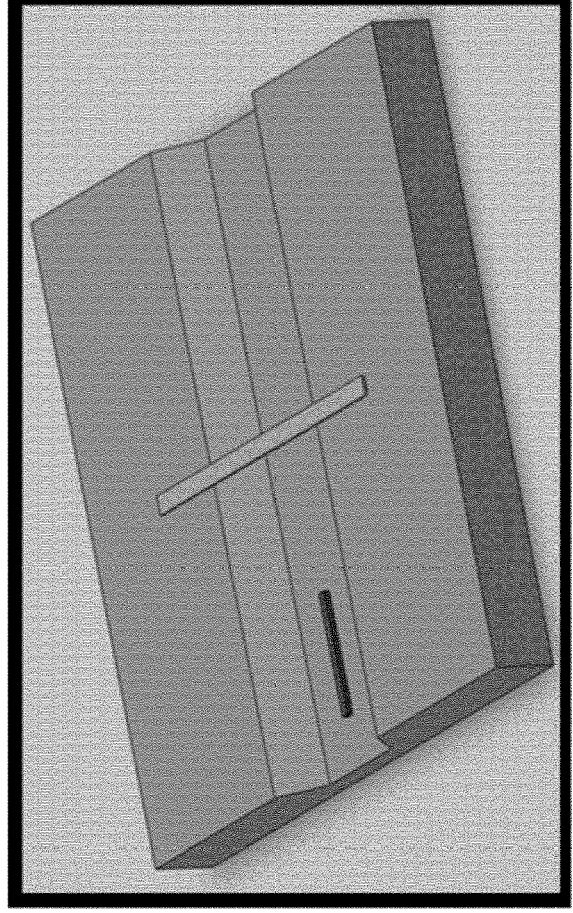
Figure 6:
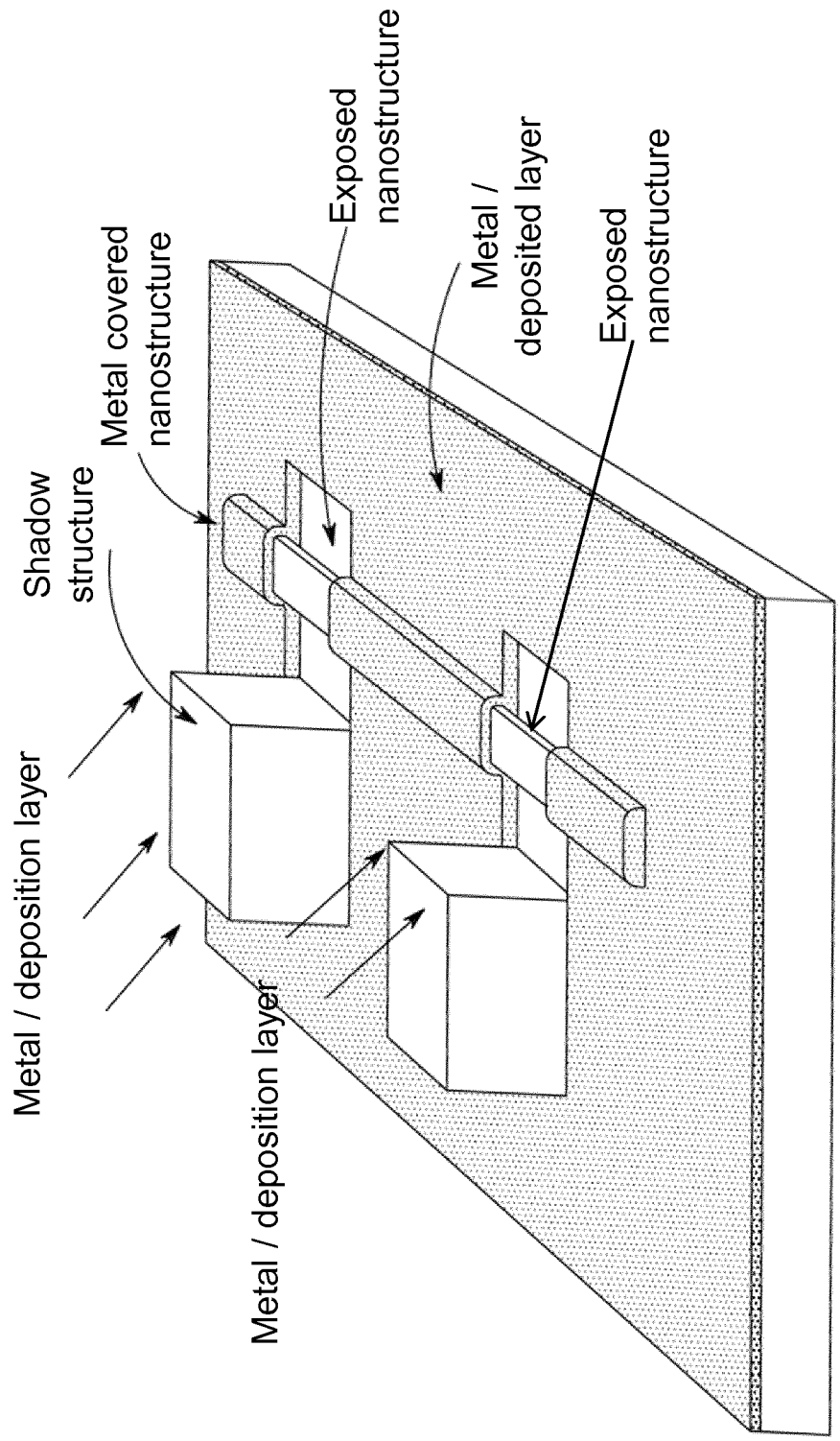
FIG. 6 illustrates another shadow-approach for patterning metallic layers on planar nanostructures grown on the surface of a substrate. Shadow structures have in FIG. 6 been predefined before the crystal growth process, and can be created by vertical deposition of for example oxide material. The planar nanostructure can be grown from the substrate surface initially and subsequently a deposition (e.g. metal) layer can be deposited from a shallow angle such that the shadow structures create shadow masks on the planar nanostructure such that there are exposed segments of the planar nanostructure surrounded by metal covered segments. The height and width of the shadow structures, the deposition angle and the location of the planar structure determines the shadow masks.
Figure 8:
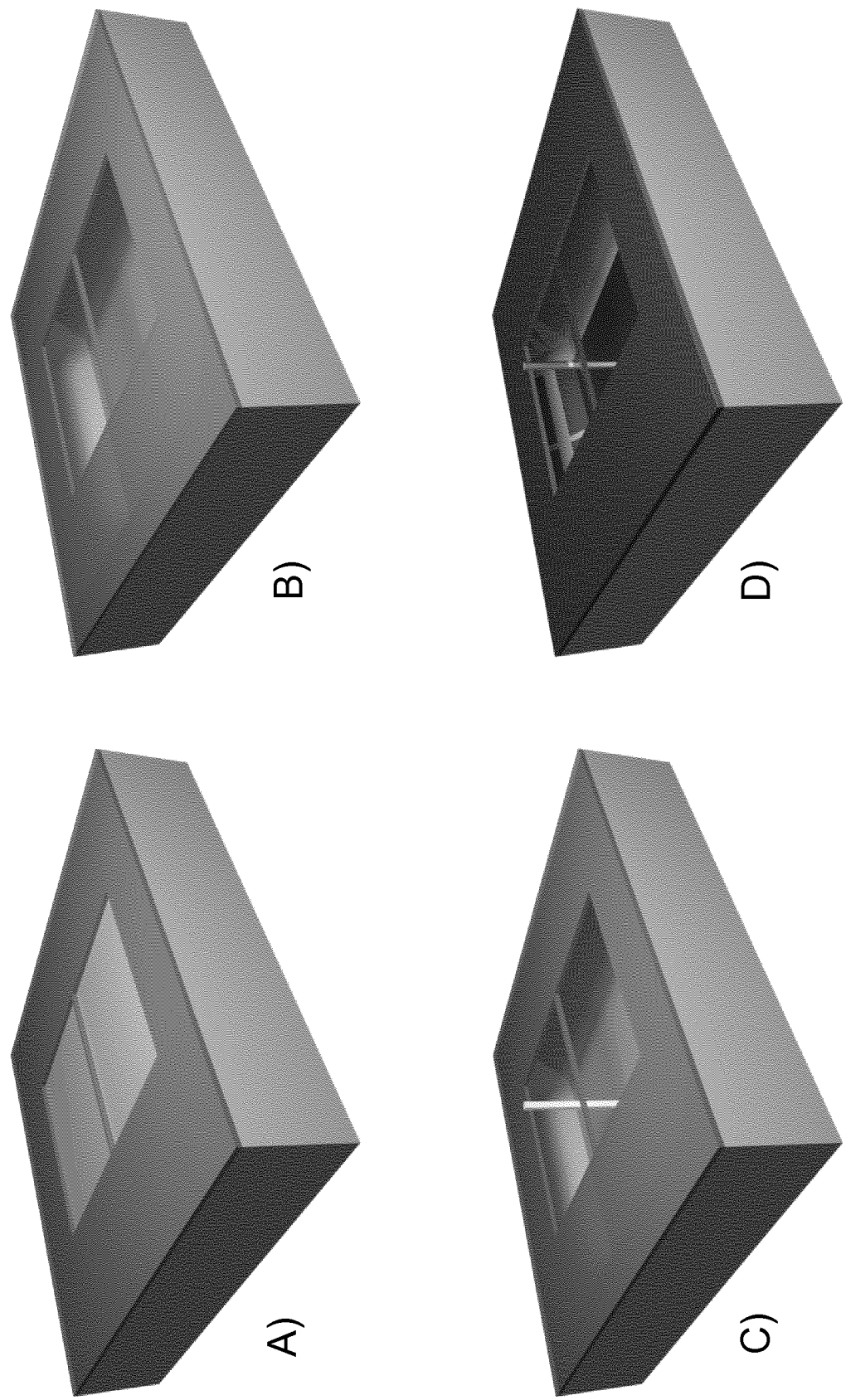
FIGS. 8A-D illustrates one of the general principles of the present disclosure. An oxide layer has been deposited on top of a semiconductor surface.
Figure 10:
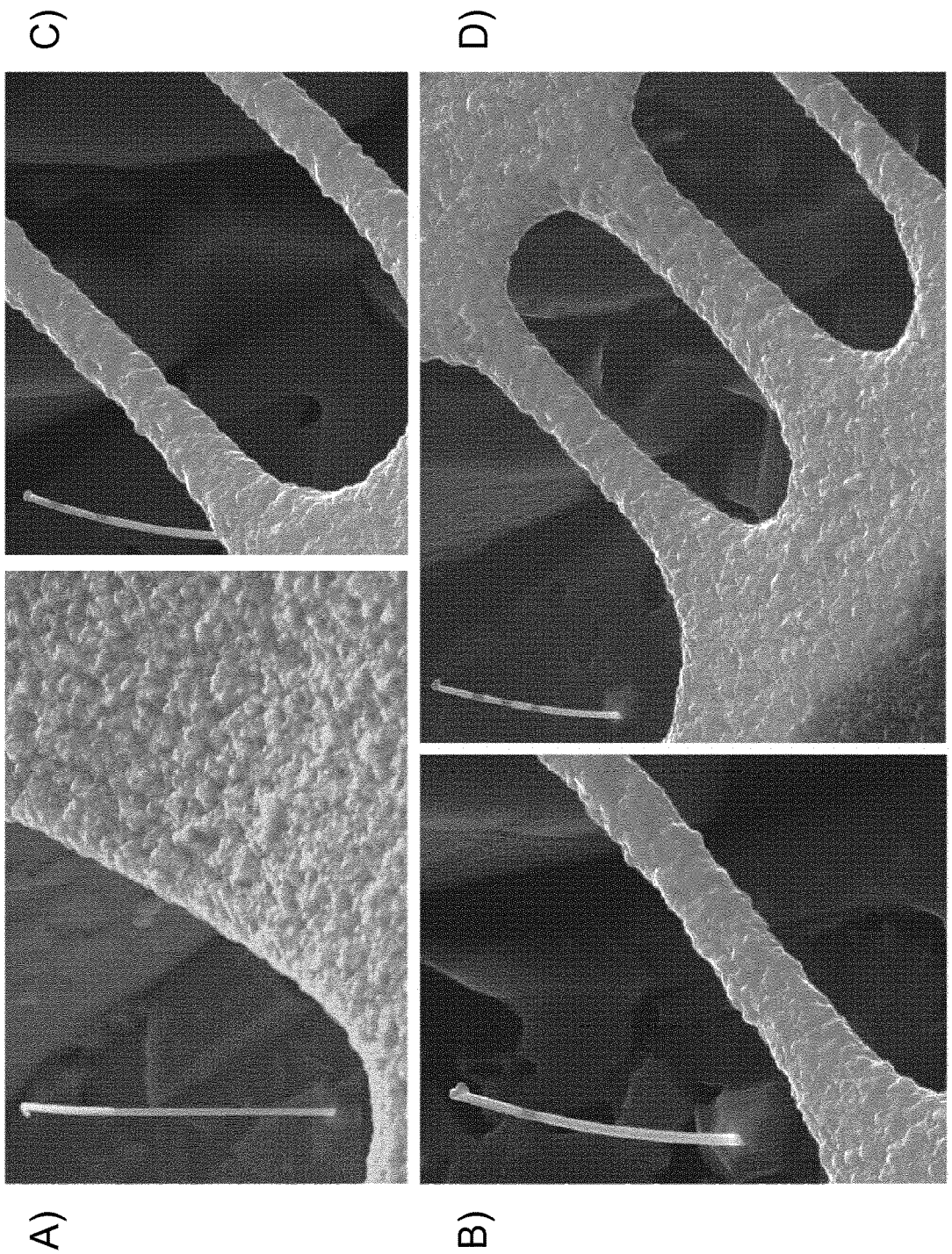
FIGS. 10A-D are scanning electrons micrographs (SEMs) of the four bridge designs illustrated in FIG. 9B. The resulting nanowires (InAs) can also be seen to the left in each SEM.
Figure 11:
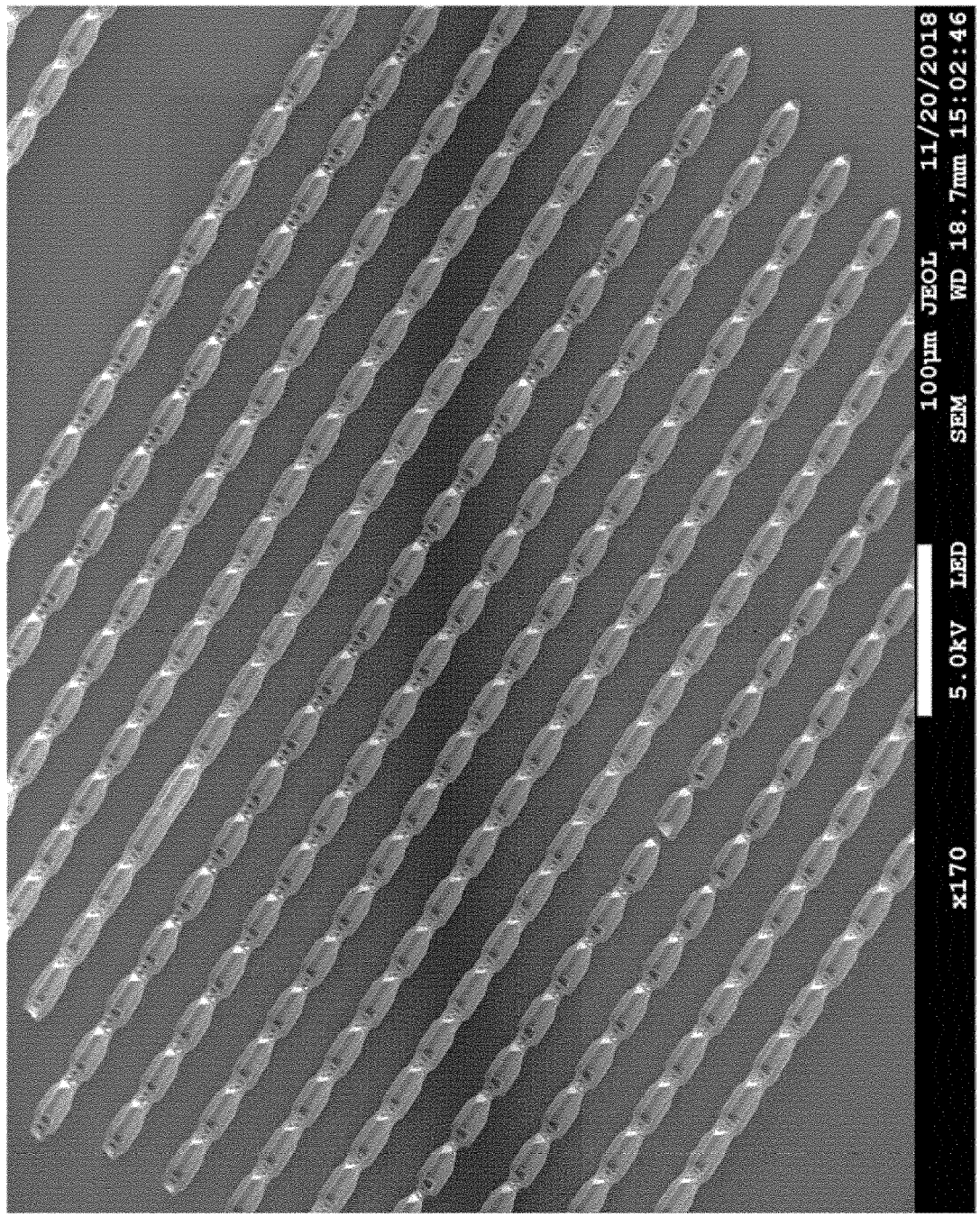
FIG. 11 demonstrates the ability for large scale parallel processing using the presently disclosed approach.
Figure 14:
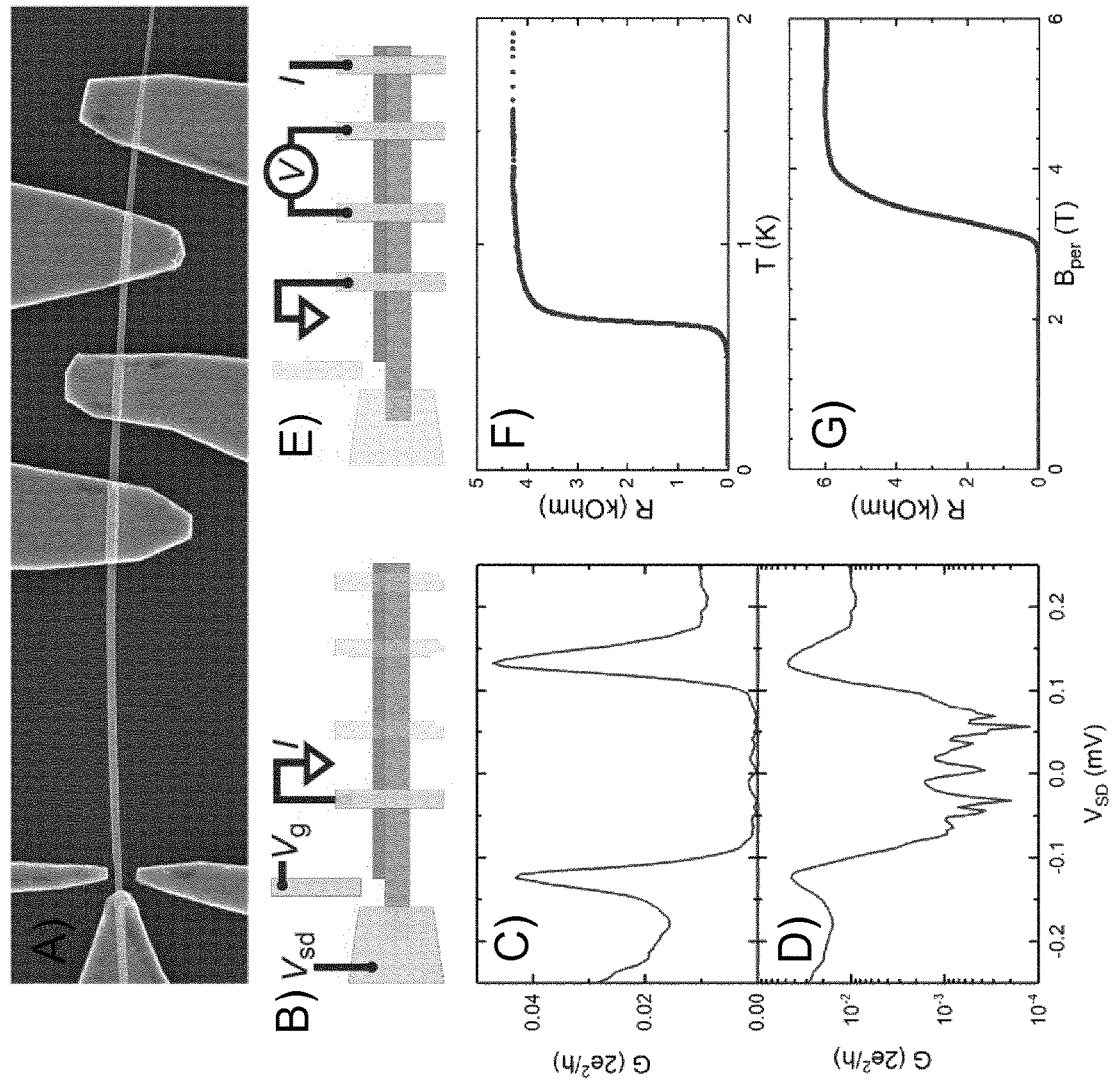
FIGS. 14A-G also show that the presently disclosed shadow deposition approach can provide a superconducting hard gap.

As an alternative to bottom-up growth the presently disclosed shadow structure approach can also be applied to planar structures, which typically are provided by a growth process in a plane substantially parallel to the substrate surface, as exemplified in FIGS. 5 and 6 and 7. Planar nanostructure can be grown by means of diffusive growth. Diffusive growth relies on diffusion of growth material elements on the surface; i.e., there does not need to be a direct line of sight from between the growth source and the place where the crystal will grow. Hence, using diffusive growth a planar nanostructure can be grown below a shadow structure, i.e. the shadow structure will not function as a shadow during diffusive growth, as exemplified in FIG. 7. Conversely, non-diffusive deposition typically takes place at low temperature (<100° C.), where diffusion is negligible such that a vertically raised structure will function as a shadow mask during non-diffusive deposition. Semiconductors are typically grown by diffusive growth whereas superconductors are typically deposited by means of non-diffusive deposition. I.e. a semiconductor layer can be defined below a shadow mask whereas a superconductor layer will be defined by the shadow mask that forms a shadow for the deposition of the superconductor on the semiconductor.

In a further process step substantially the entirety of the at least one nanostructure can be covered with at least one final layer, a final layer such as an oxide coating, i.e. a suitable dielectric. Such a final covering of the whole (or part of) structure can be seen as a coating provided for passivating and/or protecting the whole device. Normally post-processing would be needed to finalize the device, but in the approach disclosed herein the nanostructure can be grown and additional layers can be provided in a predefined pattern, i.e. post-processing can be avoided. It is then a major advantage to be able to protect the device, e.g. thereby passivating a semiconductor nanostructure in a suitable dielectric.

As exemplified in FIG. 15 the shadow pattern can be constructed such that the same shadow mask is formed on the corresponding nanostructure from a plurality of angles, thereby allowing for e.g. deposition during rotation of the substrate such that the elongated nanostructure can be covered all the way round with deposition material, or such that more the shadow pattern is formed on more than one side facet of the nanostructure. I.e. the substrate may be rotated in a plane defined by the substrate during deposition of the first and/or the at least second layer of material, such as rotated at least 180 degrees or 360 degrees. And that the shadow structure corresponding to a nanostructure may be rotationally symmetric in the plane of the substrate such that the same shadow mask is formed on the nanostructure if the substrate is rotated in the plane of the substrate during deposition of the first and/or the at least second layer of material.

Figure 16:
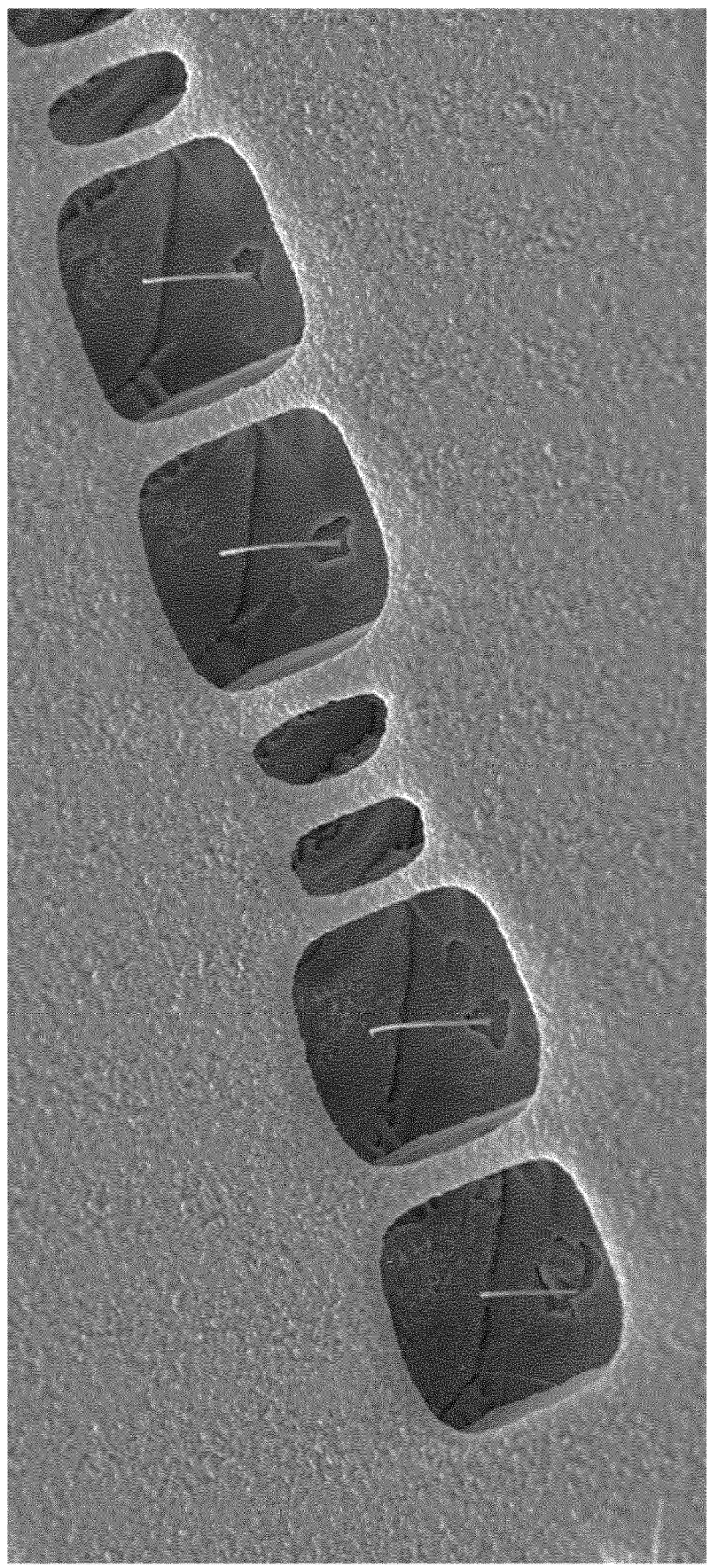
FIG. 16 is a SEM (~2500× magnification) illustrating how the presently disclosed approach extends the possibilities for hybrid semiconductor-superconductor nanostructures by enabling new geometries via double sided evaporation.
Figure 17:
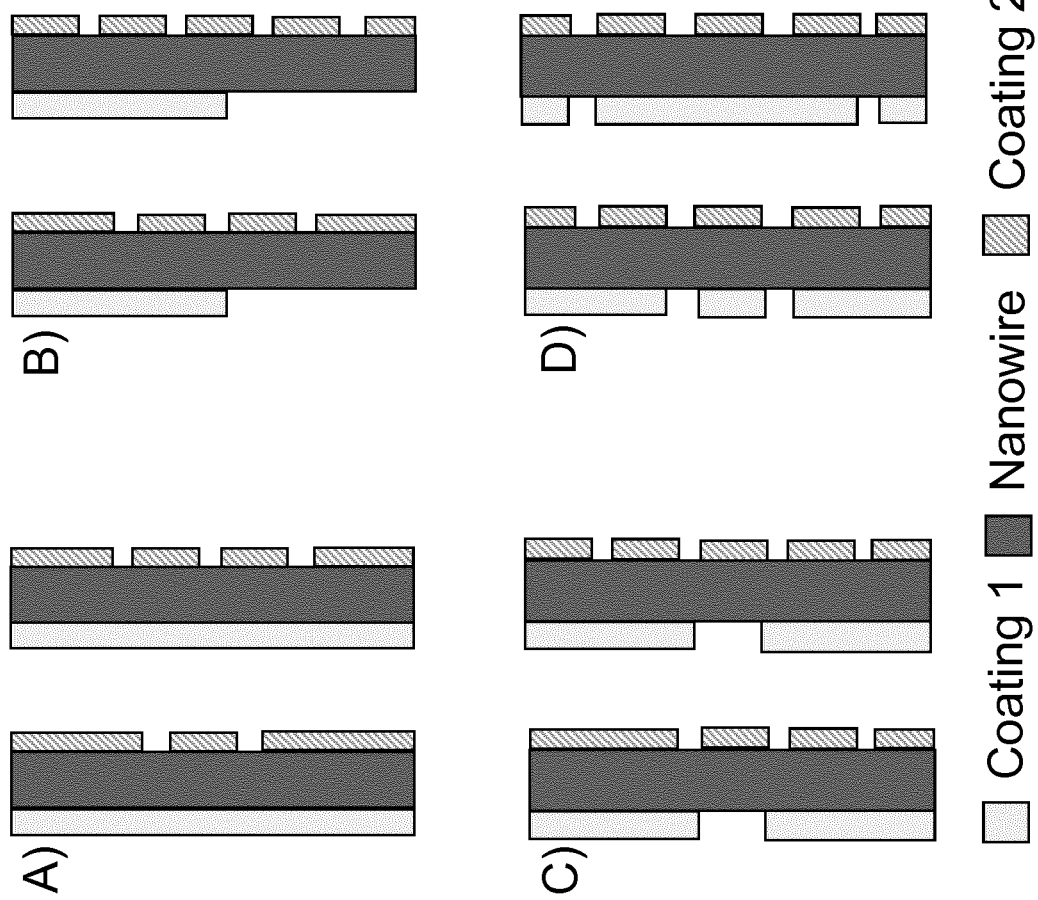
FIGS. 17A-D show examples of geometries that can be obtained using the approach outlined above in connection with FIG. 16.

FIGS. 16 and 17 exemplify how the presently disclosed approach can be utilized for double sided evaporation/deposition. As illustrated in FIG. 16 one example is to have different number of bridges on either side of the nanowire and for example use the second coating (i.e. second deposition) as contacts to probe the local density of states along the nanowire, and the effect of the first coating (i.e. first deposition), e.g. a superconductor. I.e. a nanostructure may be located in correspondence with one or more shadow structures such that a first predefined shadow mask is formed on one side of the nanostructure during deposition from a first angle, and that a second predefined shadow mask is formed on a second side of the nanostructure, opposite from the first side, during deposition from a second angle.

As an example four nanowires are seen in FIG. 16. The second nanowire from the left has a single bridge to the left and three bridges to the right, i.e. deposition from the left provides another shadow pattern than deposition from the right.

The growth of the nanostructures and the patterned deposition of layers can be provided in a vacuum chamber, and the first and/or second deposition source can be a vapor deposition source. Whereas the growth substrate with the shadow pattern can be provided beforehand in an external process, i.e. ex-situ. The vacuum chamber and the deposition source(s) can then be configured to provide a directional beam flux from the deposition source(s) during deposition.

A crystal growth compatible material is a material that can be deposited on substrate suitable for crystal growth and which is compatible for subsequent use in a crystal growth process, e.g. a vacuum or ultra-high vacuum (UHV) process, such as MBE. Several oxide materials can be used as crystal growth compatible material, one commonly used example is siliconoxide.

Hybrid Nanostructure

One key aspect when integrating superconductor and semiconductor technology has been the realization of an almost perfect interface between a semiconductor and a superconductor in the form of a metal, in particular a hybrid nanostructure with InAs and Al. Semiconductor/metal (SE/M) interfaces has so far been uncontrolled on the atomic scale. However, nanoscale device (or nanometer scale) comprising an elongated crystalline semiconductor nanostructure, such as a nanowire (crystal) or nanowhisker (crystal) or nanorod (crystal), with epitaxial interfaces between the semiconductor and a metal has been disclosed.

These nanoscale devices have been realized and exemplified by means of bottom-up growth of semiconductor/metal core-shell nanowire crystals by a combination of VLS and molecular beam epitaxy (MBE). However, as also noted in the present disclosures, planar (elongated) hybrid nanostructures can be realized also with epitaxial interfaces between semiconductor and superconductor, for example also by a combination of VLS and MBE.

One example uses InAs for the nanostructure crystal and Al is grown with epitaxially matched interfaces, which can be regarded as the ultimate limit of disorder free contact. Under certain conditions, conventional superconductors can induce a topological non-trivial superconducting state in semiconductor nanowires. Proposals based on proximity effect in semiconductor nanowires with strong spin-orbit are appealing because the key ingredients are known in the art. However, all previous instances of proximitized semiconductors show significant tunneling conductance below the superconducting gap, suggesting a continuum of subgap states that nullifies topological protection—an unsolved issue referred to as the "soft gap problem". Such soft-gaps will induce decoherence of Majorana qubits, and has been considered a major road-block for the future of topological quantum information in such devices. But it turns out that the hardness of the induced superconductivity depends crucially on the quality and uniformity of the semiconductor/superconductor (SE/SU) interfaces. This situation is analogous to that of conventional semiconductor devices where the quality of the involved interfaces is the primary parameter determining the performance. For this reason, semiconductor technology was revolutionized by the invention of epitaxial growth of heterostructures, which enables atomic-scale design of semiconductor interfaces and tailor-made profiles of the electronic band structures, doping levels and strain. So far, however, the world of semiconductor epitaxy has had little to do with the world of superconductivity.

But with the advent of the InAs nanostructures with epitaxial Al it has been demonstrated that for temperatures below the superconducting transition temperature aluminum becomes superconducting and the Al layer induces a superconducting gap into the InAs by virtue of the proximity effect. In contrast to all previous studies, however, the induced gap remains hard i.e., free of sub-gap states, likely due to the perfectly uniform InAs//Al interface. The soft-gap problem has therefore been solved, because a hard superconducting gap induced by proximity effect in a semiconductor, is demonstrated by using epitaxial Al-InAs superconductor-semiconductor hybrid nanostructures. As also mentioned previously a hard superconducting gap has been demonstrated in InSb semiconductor nanowires with an NbTiN superconducting layer (GuI et al., Nano Lett. 2017, 2690-2696) where the interface between semiconductor and superconductor is not epitaxial, but merely very clean and free of impurities.

In the presently disclosed approach, the first layer and/or second layer and/or additional layers can for example be crystalline and epitaxial, crystalline and non-epitaxial or even amorphous. An important aspect is that the presently disclosed method allows for defining one or more patterned layers without the need for processing or ever breaking the vacuum. In this way, the presently disclosed method increases the potential material combinations since it is not necessary to develop special methods to either achieve an epitaxial match, or find the correct cleaning/passivation solution for each material.

The nanostructure may be provided in a semiconducting material, e.g. a semiconducting material selected from the group of III-V combinations, such as InAs, InP, InSb, GaAs, GaSb, AlSb and InGaAs, or group IV elements such as Si or Ge, or II-VI combinations such as ZnO, ZnSe and CdSe, or I-VII combinations. The deposited first and/or second layer may naturally be a metal but may be many types of materials. Further, the deposited layer(s) may be provided in a material with superconducting properties below a critical temperature $T_c$. A preferred crystalline semiconductor nanostructure may be InAs, in particular because InAs nanostructures allow for high quality field effect JJs due to the highly transparent Schottky barrier-free SN interface.

The nanostructure may be crystalline, i.e. it is a single crystal or it is composed of several crystals, e.g. large single crystal elements, forming a crystalline structure. In some embodiments the elongated crystalline nanostructure may be seen as a substantially one-dimensional crystalline structure. It has been demonstrated in InAs with an Al facet layer with Wurtzite(WZ)/FCC or Zinc Blende(ZB)/FCC crystal orientations, which can form uniform crystal morphologies and highly ordered and well defined epitaxial SE/M interfaces between the semiconductor (SE, e.g. InAs) and the metal (M, e.g. Al). However, the epitaxial match can be realized with other material combinations with similar structures and lattice spacings. For relevant FCC metals this could for example be Au and Ag, and for semiconductors this is for example the other members of the '6.1 Å family': GaSb and AlSb. Hence, high quality epitaxial growth of contacts to crystalline nanostructures can therefore be realized with many material combinations.

Hybrid nanostructures for Josephson junctions are typically superconducting along the longitudinal direction of the nanostructure, e.g. like a superconducting wire, and the weak link to be used in the JJ is created by removing superconducting material from a segment of the hybrid nanostructure by means of a shadow mask defined by shadow structure thereby breaking the superconducting properties in a small segment (the gap in the surface layer(s)) of the nanostructure.

In one embodiment the nanostructure is an elongated hybrid nanostructure comprising an elongated crystalline semiconductor nanostructure having at least one substantially plane side facet, and a crystalline superconductor first facet layer deposited on at least one side facet along at least part of the length of the crystalline semiconductor nanostructure, wherein the crystalline structure of the semiconductor nanostructure is epitaxially matched with the crystalline structure of the first facet layer on the interface formed between the semiconductor nanostructure and the crystalline superconductor.

In a further embodiment the elongated hybrid nanostructure comprises an elongated crystalline semiconductor nanostructure having a plurality of substantially plane side facets, and a crystalline superconductor first facet layer covering one or more of said plane side facets of at least part of the length of the crystalline semiconductor nanostructure, wherein the crystalline structure of the semiconductor nanostructure is epitaxially matched with the crystalline structure of the first facet layer on the interface of at least one side facet, and wherein the weak link is formed by a semiconductor segment of the elongated hybrid nanostructure where the first facet layer has been removed by means of a nanostructure shadow mask provided during surface layer deposition to provide a semiconductor weak link.

Having an epitaxial match between the semiconductor and the superconductor has at least one major effect. The superconductor first layer forms an atomically precise SN interface leading to a proximity induced gap in the semiconductor nanostructure with a low density of states below the superconducting gap. In other words, the epitaxial match generates a hard gap.

In one embodiment of the invention each two-dimensional interface between a crystalline nanostructure and a deposited layer is lattice matched and/or domain matched in at least one dimension, possibly in both dimensions.

Naturally the first layer may be crystalline. The two-dimensional interface between a crystalline nanostructure and the deposited layer may be epitaxial. However, as also describe above it may suffer than the interface is homogeneous and free of impurities but non-epitaxially matched. The two-dimensional interfaces between the crystalline nanostructure and the deposited layer(s) may be epitaxial, such as simultaneously epitaxially matched. Thus, the crystalline structure of the nanostructure may be epitaxially matched with the crystalline structure of the deposited layer. In one embodiment each two-dimensional interface between the crystalline nanostructure and the deposited layer(s) is simultaneously epitaxially matched, domain matched and lattice matched in both dimensions.

Epitaxial match in the interface between two crystalline layers may not be entirely unusual if the crystal structures of the two crystalline layers are equal. However, it has been demonstrated that an epitaxial interface can be realised even when the crystal structure (and/or crystal phase) of the crystalline nanostructure is different from the crystal structure (and/or crystal phase) of the deposited layer, such as when the crystal structure (and/or crystal phase) of the elongated crystalline nanostructure and the crystal structure (and/or crystal phase) of the deposited layer(s) belong to different lattice systems and/or if the Bravais lattice of the elongated crystalline nanostructure is different from the Bravais lattice of the deposited layer(s). If for example the crystal structure of the elongated crystalline nanostructure is zincblende (ZB) then the crystal structure of the deposited layer(s) is not zincblende, i.e. the crystal structures are different. Correspondingly if for example the crystal structure of the elongated crystalline nanostructure is wurtzite then the crystal structure of the deposited layer(s) is not wurtzite, i.e. the crystal structures are different. E.g. the crystal structure of the elongated crystalline nanostructure may be zincblende (ZB) or wurtzite (WZ) and the crystal structure of the facet layer belongs to the cubic crystal system, such as primitive cubic, BCC or FCC, as demonstrated previously with InAs nanowires (ZB or WZ) with an Al (FCC) epitaxially matched deposited layer(s).

The elongated crystalline nanostructure may be homogeneous, i.e. formed from the same compound material in the longitudinal/axial direction and/or in the radial direction. However, the elongated crystalline nanostructure may in itself be a heterogeneous structure, e.g. a heterostructured nanowire crystal. E.g. the crystalline nanostructure may be a heterostructured nanowire crystal composed of different compounds in the axial and/or radial direction.

As previously stated it is unusual that an epitaxial interface is provided between layers having different crystal structures and this opens for epitaxial interfaces between semiconductors (which are often wurtzite or zincblende) and metals (which are often BCC or FCC). In one embodiment the deposited layer(s) is hence a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W. Some of these metals become superconducting below a critical temperature. However, deposited layers of other materials may as well be provided where an epitaxial interface to the nanostructure can be realised, e.g. selected from the group of high temperature ceramic superconductors, such as copper oxide or cuprate superconductors, which often have a perovskite crystal structure. Other possible superconductors are superconducting alloys such as NbN, NbTiN, NiGe, NbSn, and $MgB_2$.

The cross-section of a nanowire may e.g. be square, hexagonal, or octagonal providing a total of four, six or eight side facets, respectively. Consequently, a deposited (facet) layer may be covering at least a part of 1, 2, 3, 4, 5, 6, 7, 8 or more of the side facets.

The thickness of the deposited layer(s) may be less than 300 nm, or less than 250 nm, or less than 200 nm, or less than 150 nm, or less than 100 nm, or less than 90 nm, or less than 80 nm, or less than 70 nm, or less than 60 nm, or less than 50 nm, or less than 45 nm, or less than 40 nm, or less than 35 nm, or less than 30 nm, or less than 25 nm, or less than 20 nm, or less than 19 nm, or less than 18 nm, or less than 17 nm, or less than 16 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm.

At the initial stage of the growth of the deposited layer(s) islands may form at the nanostructure surface. During this growth the temperature of the substrate may play an important role with regard to the spacing between the islands. If the temperature is low enough, the spacing is so small that the islands will merge at a very thin thickness of the deposited layer(s). As discussed further below this may lead to surface driven grain growth. A thickness of the deposited layer(s) below 15 nm may only be obtained if the temperature during growth/deposition of the facet layer is below −20° C., or below −25° C., or even below −30° C.

In the case of bottom-up grown elongated crystalline nanostructure, such as nanowires, the cross-sectional diameter of the nanostructure may be between 10 and 200 nm, such as between 10 and 20 nm, or between 20 and 30 nm, or between 30 and 40 nm, or between 40 and 50 nm, or between 50 and 60 nm, or between 60 and 70 nm, or between 70 and 80 nm, or between 80 and 90 nm, or between 90 and 100 nm, or between 100 and 110 nm, or between 110 and 120 nm, or between 120 and 140 nm, or between 140 and 160 nm, or between 160 and 180 nm, or between 180 and 200 nm.

The length of the nanostructure may be between 1 and 50 µm, or between 1 and 2 µm, or between 2 and 3 µm, or between 3 and 4 µm, or between 4 and 5 µm, or between 5 and 6 µm, or between 6 and 7 µm, or between 7 and 8 µm, or between 8 and 9 µm, or between 9 and 10 µm, or between 10 and 12 µm, or between 12 and 14 µm, or between 14 and 16 µm, or between 16 and 18 µm, or between 18 and 20 µm, or between 20 and 50 µm. This applies to both planar grown and bottom-up grown nanostructures.

In the case of planar grown planar structures the width in the plane of the growth surface can be much larger than the height perpendicular to the growth surface, i.e. the direction of the growth, however still smaller than the length of the nanostructure. The width can typically be between 50 nm and 1 µm, e.g. on order of hundreds of nanometres. The height of a planar nanostructure is typically between 5 and 50 nm.

In one embodiment of the present invention, the length of the semiconductor segment is between 10 and 500 nm, or between 20 and 400 nm, or between 40 and 300 nm, more preferably between 100 and 250 nm, most preferably between 150 and 200 nm.

The shadow structures are typically offset from the substrate surface such that a shadow mask can be created on an adjacent nanostructure for a suitable deposition angle. Hence, preferably the upper surface of at least a part of the shadow structure(s) is vertically offset from the substrate surface by at least 1 µm, or by at least 500 nm, or by at least 2 µm, or by at least 5 µm.

In yet another embodiment of the present invention, the cross-section of the crystalline semiconductor nanostructure is square, thereby providing a total of four side facets or hexagonal, thereby providing a total of six side facets.

Growing Nanowires with an Epitaxial Facet Layer

Elongated nanostructures, and in particular elongated crystalline semiconductor nanostructures, may be grown at elevated temperatures, e.g. above 300° C., above 350° C., or above 400° C., e.g. in the normal direction on a plane substrate. Importantly the deposited layer(s) is grown/deposited directly on at least one plane surface of the crystalline semiconductor nanostructure at a much reduced temperature compared to what has previously been tried, e.g. below 50° C. or below 20° C. To provide a thin deposited layer(s), e.g. on the order of 10 nm, the temperature can be reduced even further, i.e. below 0° C., or below −5° C., or below −10° C., or below −15° C., or below −20° C., or below −25° C., or below −30° C. The reduction in temperature may also help to prevent any material sticking at the semiconductor surface before the deposited layer(s) is deposited. An oxide free interface between the surface of the semiconductor and the deposited layer(s) is thereby obtained, i.e. an oxide free epitaxial interface/contact between a semiconductor nanostructure and a metal/superconductor can be obtained. As demonstrated previously, nanowires grown in the conventional $[0001]_{WZ}/[111]_{ZB}$ direction have a facet layer in the form of a cubic metal phase with the [11-2] normal to the side facets of the nanowire and [111] along the nanowire axis. This is indeed unique because the symmetry allows large single crystal segments with simultaneous epitaxial match on all facets of the nanowire.

As previously demonstrated: If the deposited layer is deposited at very low temperature it is possible to grow a layer such that the two-dimensional interface between the deposited layer and the elongated crystalline nanostructure is epitaxially matched, even when the nanostructure and the deposited layer have fundamentally different crystal structures. This opens the door for epitaxial matches between semiconductors and metals on the plane surfaces of hybrid nanostructures, like nanowires or planar nanostructures. The key issue in the growth method is the low temperature when depositing the layer to provide for initial surface driven growth of small crystal grains of the deposited layer. Thus, after the elongated nanostructures have been grown, all sources (e.g. in an MBE chamber) must be shut off such that the growth chamber is empty and then lowering the temperature, which can be lowered to below 0° C. or much lower, within seconds or minutes if external cooling sources like liquid nitrogen is used.

The background pressure may also be reduced before the provision of the first facet layer. If the process takes place in a vacuum chamber, the background pressure may be reduced. This may also help to prevent any material sticking at the nanowire surface before the first facet layer is deposited.

In order to hit a plane surface, e.g. the side facet(s) of the elongated crystalline nanostructures or the top surface of a planar nanostructure, when depositing a layer, the source of the deposited layer may be located at a finite angle, e.g. less than 10 deg or less than 5 deg, such as 2-3 degrees, (e.g. inside an MBE vacuum chamber) to the normal direction of the substrate during deposition of the layer. In order to cover additional side facets of an elongated crystalline nanostructure, such as a nanowire, the substrate may be rotated during deposition of the facet layer. This rotation may also be provided to ensure that a gap is provided in a deposited layer when a shadow mask is provided.

As also stated previously the temperature of the substrate before deposition of the layer may preferably be reduced to a temperature below 10° C., or below 0° C., or below −5° C., or below −10° C. or below −15° C., or below −20° C., such as below −25° C., more preferably below −30° C. These low temperatures have been realized in a standard MBE chamber by reducing the background pressure and waiting for several hours. However, the temperature may be reduced much faster by applying an external source of cooling, e.g. liquid nitrogen, to cool the substrate. Even lower temperatures for depositing/growing the facet layer can then be reached. However, most importantly the time to reach the low temperatures can be much reduced.

As also stated elsewhere epitaxial interfaces are not a necessity in order to obtain for example a hard gap. I.e. low temperature deposition is not necessary in order to obtain a homogeneous and impurity free interface, in particular when the growth and deposition processes can be carried out without breaking the vacuum ensuring clean growth and deposition conditions.

Epitaxial Domain Matching for Other Material Combinations

It may be difficult to predict material combinations that will form epitaxial interfaces. For example, surface diffusion lengths of metals on semiconductors are not generally available in the literature, and for a given metal, the large number of possible planes and surface orientations makes it difficult to predict domain matches. However, in the thick shell limit, where strain and grain boundary driven growth dominates, the lowest energy configuration is most likely when the SE and M crystals with similar symmetry groups (ZB or WZ and FCC) orientate along the same type of symmetry classes, especially if the bicrystal match is not to large. For nanowires grown in the conventional $[0001]_{WZ}/[111]_{ZB}$ direction, a cubic metal phase with the $[11\text{-}2]$ normal to the facets and $[111]$ along the nanowire axis is unique in that its symmetry allow large single crystal segments with simultaneous epitaxial match on all facets of the nanowire. Thus, it is natural to expect, that if this orientation matches the semiconductor for a particular metal, it is likely to form in the thick film limit. Thus it is interesting to search among the cubic metals for matches in this orientation. Table 1, 2 and 3 list the domain strains for a range of metals grown on the important cases of InAs, InSb, and GaAs. In the general notation $$\left(\frac{n_{M,\square}}{n_{SE,\square}}, \varepsilon_{\square}\right) \times \left(\frac{n_{M,\perp}}{n_{SE,\perp}}, \varepsilon_{\perp}\right),$$

we distinguish between interfacial match of interfacial units in the components and the corresponding strain along the length and along the transverse direction to the NW, as expected from relaxed bulk values.

If ZB and FCC orientation along the same type symmetry classes, the two numbers are identical in the parallel and perpendicular directions. The tables below are suggestions for possible feasible material combinations—combinations without match in the tables may form epitaxial interfaces in other orientations.

TABLE 1

Domain matching for InAs with different cubic metals in the [11-2] out-of-plane orientation.

| | | Domain fraction | | | | | | | | |
|---|---|---|---|---|---|---|---|---|---|---|
| | Lattice const. | ½ 0.5 | ⅓ 0.333 | ⅔ 0.667 | ¼ 0.25 | ¾ 0.75 | ⅕ 0.2 | ⅖ 0.4 | ⅗ 0.6 | ⅘ 0.8 |
| ZB//FCC FCC metal | | | | | | | | | | |
| Ne | 4.43 | 31.6 | 54.4 | 8.8 | 65.8 | 2.6 | 72.6 | 45.3 | 17.9 | 9.4 |
| Al | 4.05 | 25.2 | 50.1 | 0.3 | 62.6 | 12.2 | 70.1 | 40.2 | 10.2 | 19.7 |
| Ar | 5.26 | 42.4 | 61.6 | 23.2 | 71.2 | 13.6 | 77.0 | 53.9 | 30.9 | 7.9 |
| Ca | 5.58 | 45.7 | 63.8 | 27.6 | 72.9 | 18.6 | 78.3 | 56.6 | 34.9 | 13.1 |
| Ni | 3.52 | 13.9 | 42.6 | 14.7 | 57.0 | 29.1 | 65.6 | 31.2 | 3.3 | 37.7 |
| Cu | 3.61 | 16.1 | 44.1 | 11.9 | 58.0 | 25.9 | 66.4 | 32.9 | 0.7 | 34.3 |
| Kr | 5.72 | 47.0 | 64.7 | 29.4 | 73.5 | 20.6 | 78.8 | 57.6 | 36.5 | 15.3 |
| Sr | 6.08 | 50.2 | 66.8 | 33.6 | 75.1 | 25.3 | 80.1 | 60.1 | 40.2 | 20.3 |
| Rh | 3.8 | 20.3 | 46.9 | 6.3 | 60.1 | 19.6 | 68.1 | 36.2 | 4.3 | 27.5 |
| Pd | 3.89 | 22.1 | 48.1 | 3.8 | 61.1 | 16.8 | 68.9 | 37.7 | 6.6 | 24.6 |
| Ag | 4.09 | 25.9 | 50.6 | 1.3 | 63.0 | 11.1 | 70.4 | 40.8 | 11.1 | 18.5 |
| Xe | 6.2 | 51.1 | 67.4 | 34.9 | 75.6 | 26.7 | 80.5 | 60.9 | 41.4 | 21.8 |
| Ce | 5.16 | 41.3 | 60.9 | 21.7 | 70.6 | 11.9 | 76.5 | 53.0 | 29.6 | 6.1 |
| Yb | 5.49 | 44.8 | 63.2 | 26.4 | 72.4 | 17.2 | 77.9 | 55.9 | 33.8 | 11.7 |
| Ir | 3.84 | 21.1 | 47.4 | 5.2 | 60.6 | 18.3 | 68.4 | 36.9 | 5.3 | 26.2 |
| Pt | 3.92 | 22.7 | 48.5 | 3.0 | 61.4 | 15.9 | 69.1 | 38.2 | 7.3 | 23.6 |

TABLE 1-continued

Domain matching for InAs with different cubic metals in the [11-2] out-of-plane orientation.

| | | Domain fraction | | | | | | | | |
|---|---|---|---|---|---|---|---|---|---|---|
| | ½ Lattice const. | ⅓ 0.5 | ⅔ 0.333 | ¼ 0.667 | ¾ 0.25 | ⅕ 0.75 | ⅖ 0.2 | ⅗ 0.4 | ⅘ 0.6 | 0.8 |
| Au | 4.08 | 25.8 | 50.5 | 1.0 | 62.9 | 11.4 | 70.3 | 40.6 | 10.9 | 18.8 |
| Pb | 4.95 | 38.8 | 59.2 | 18.4 | 69.4 | 8.2 | 75.5 | 51.0 | 26.6 | 2.1 |
| Ac | 5.31 | 43.0 | 62.0 | 23.9 | 71.5 | 14.4 | 77.2 | 54.4 | 31.5 | 8.7 |
| Th | 5.08 | 40.4 | 60.2 | 20.5 | 70.2 | 10.6 | 76.1 | 52.3 | 28.4 | 4.6 |
| ZB//BCC | | | | | | | | | | |
| Li | 3.49 | 13.2 | 42.1 | 15.7 | 56.6 | 30.2 | 65.3 | 30.6 | 4.2 | 38.9 |
| Na | 4.23 | 28.4 | 52.3 | 4.5 | 64.2 | 7.4 | 71.4 | 42.7 | 14.1 | 14.6 |
| K | 5.23 | 42.1 | 61.4 | 22.8 | 71.0 | 13.1 | 76.8 | 53.7 | 30.5 | 7.3 |
| V | 3.02 | 0.3 | 33.1 | 33.7 | 49.8 | 50.5 | 59.9 | 19.8 | 20.4 | 60.5 |
| Cr | 2.88 | 5.2 | 29.9 | 40.2 | 47.4 | 57.8 | 57.9 | 15.9 | 26.2 | 68.3 |
| Fe | 2.87 | 5.5 | 29.6 | 40.7 | 47.2 | 58.3 | 57.8 | 15.6 | 26.7 | 68.9 |
| Rb | 5.59 | 45.8 | 63.9 | 27.7 | 72.9 | 18.7 | 78.3 | 56.6 | 35.0 | 13.3 |
| Nb | 3.3 | 8.2 | 38.8 | 22.4 | 54.1 | 37.7 | 63.3 | 26.6 | 10.2 | 46.9 |
| Mo | 3.15 | 3.8 | 35.9 | 28.2 | 51.9 | 44.2 | 61.5 | 23.1 | 15.4 | 53.9 |
| Cs | 6.05 | 49.9 | 66.6 | 33.2 | 75.0 | 24.9 | 80.0 | 59.9 | 39.9 | 19.9 |
| Ba | 5.02 | 39.7 | 59.8 | 19.5 | 69.8 | 9.5 | 75.9 | 51.7 | 27.6 | 3.5 |
| Eu | 4.61 | 34.3 | 56.2 | 12.4 | 67.1 | 1.4 | 73.7 | 47.4 | 21.2 | 5.1 |
| Ta | 3.31 | 8.5 | 39.0 | 22.0 | 54.2 | 37.3 | 63.4 | 26.8 | 9.8 | 46.4 |
| W | 3.16 | 4.1 | 36.1 | 27.8 | 52.1 | 43.8 | 61.7 | 23.3 | 15.0 | 53.4 |

TABLE 2

Domain matching for InSb with different cubic metals in the [11-2] out-of-plane orientation.

| | | Domain fraction | | | | | | | | |
|---|---|---|---|---|---|---|---|---|---|---|
| | ½ lattice const | ⅓ 0.5 | ⅔ 0.333 | ¼ 0.667 | ¾ 0.25 | ⅕ 0.75 | ⅖ 0.2 | ⅗ 0.4 | ⅘ 0.6 | 0.8 |
| fcc metal | | | | | | | | | | |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| BCC | | | | | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

TABLE 3

Domain matches for GaAs with different cubic metals in the [11-2] out-of-plane orientation.

|  | ½ lattice const | ⅓ 0.5 | ⅔ 0.333 | ¼ 0.667 | ¾ 0.25 | ⅕ 0.75 | ⅖ 0.2 | ⅗ 0.4 | ⅘ 0.6 | 0.8 |
|---|---|---|---|---|---|---|---|---|---|---|
| fcc metal | | | | | | | | | | |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| BCC | | | | | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

Nanoscale Devices

The present disclosure further relates to a nanoscale device manufactured according to the herein disclosed methods. More specifically for example a nanoscale device comprising an elongated device nanostructure having a gap in the surface layer formed by the presently disclosed method, this gap forming a tunnel barrier in the case of superconducting facet layer(s), i.e. a Josephson junction.

Hence, the present disclosure further relates to a Josephson junction manufactured in-situ according to the presently disclosed method, e.g. a Josephson junction comprising an elongated hybrid nanostructure comprising superconductor and semiconductor materials and a weak link, wherein the weak link is formed by a semiconductor segment of the elongated hybrid nanostructure wherein the superconductor material has been removed to provide a semiconductor weak link, i.e. equivalent to the semiconductor weak link being formed by a gap in the superconductor material provided by means of a shadow mask formed by an adjacent elongated nanostructure.

In further embodiment the present disclosure further relates to a tuneable Josephson device comprising the above mentioned Josephson junction and an electrostatic side gate located adjacent to the weak link of the Josephson junction and configured to apply and control a voltage across the weak link. The electrostatic side gate may be configured to control the electron density in the semiconductor weak link by tuning the voltage of the electrostatic side gate. The electrostatic side gate may further be configured to control the Josephson energy through depletion in the semiconductor weak link by tuning the voltage of the electrostatic side gate.

Different bridge geometries can be imagined for different device architectures to provide for a new in-situ manufacturing approach of known devices:

Using a single wide bridge, nanostructures half-covered, in for example metal, can be provided. These are similar to the structures produced by etching in Chang, et al, Nature Nanotechnology 10, 232 (2015). It should be noted that such nanostructures can also be the result of shadowing from the trench walls—i.e. without the need for bridges.

Narrow bridges can produce Metal-Nanowire-Metal junctions where the size of the exposed nanowire segment is determined by the width of the bridge. Such junction constitutes the conventional nanowire field-effect transistor. In the case of superconductors and shorts segments these structures realizes the gate-tunable nanowire Josephson junction with a hard gap, cf. T. Larsen, Physical Review Letters 115, 127001 (2015).

Double angle evaporation on a single bridge can provide Metal1-nanowire-Metal2 junctions. The size of the junction is determined by the width of the bridge and the angle of evaporation. For Metal1=Superconductor, Metal2=normal metal, these structures can provide canonical Majorana devices, cf. Mourik et al, Science 336, 1003 (2012) and Deng et al., Science 354, 1557-1562 (2016)

Two parallel bridges with a narrow gap can result in a nanostructure such as Metal-NW-short Metal-NW-Metal. For the case of superconductors, this structure is a Majorana island, cf. Albrecht et al., Nature 531, 206, 2016)

More than two parallel bridges, e.g. three, four, five or more parallel bridges, can also be provided. A Majorana qubit can for example be realized by means of three parallel bridges in order to provide two superconducting islands.

With appropriate adjustments of the layout of the shadow structure and nanowire growth positions, the presently disclosed is also compatible with nanowire crosses or T-shape junction which can be made by changing the growth direction by 90 deg at a certain height, making nanowires grow parallel to the substrate and join under the bridge.

EXAMPLES

Proof of the shadow approach concept has been experimentally demonstrated:

1. Superconductor-Nanowire shadow junction is illustrated in FIG. 3C, where a layer of a superconducting metal (tantalum) has been deposited on two side facets of only a segment of an InAs nanowire.

2. Superconductor-nanowire-superconductor (S-NW-S) junction is illustrated in FIG. 3D, where two segments of superconductor surrounds a small segment of exposed NW.

3. S-NW-Sdot-NW-S junctions have been demonstrated (not shown) where "Sdot" is a small superconducting dot surrounded on each side of exposed NW which correspondingly have superconducting segment on each side.

4. Junction formed on a "kinked" nanowire as illustrated in FIG. 3E showing a kinked nanowire with an S-NW-S junction on the kinked part.

5. Provision of one or more superconducting islands can be provided. A superconducting island is a segment of a superconductor surrounded on each side by normal/semiconductor segments.

It has been experimentally verified that junctions can be fabricated according to the shadow approach disclosed herein and that the junctions maintain the key property of the hard superconducting gap required for application in topological quantum information processing or other superconducting technologies. The method is applicable for any superconductor and it has been demonstrated that the hard-gap is maintained in structures of tantalum and InAs.

The preparation of substrates may follow the following steps.

Figure 2C:
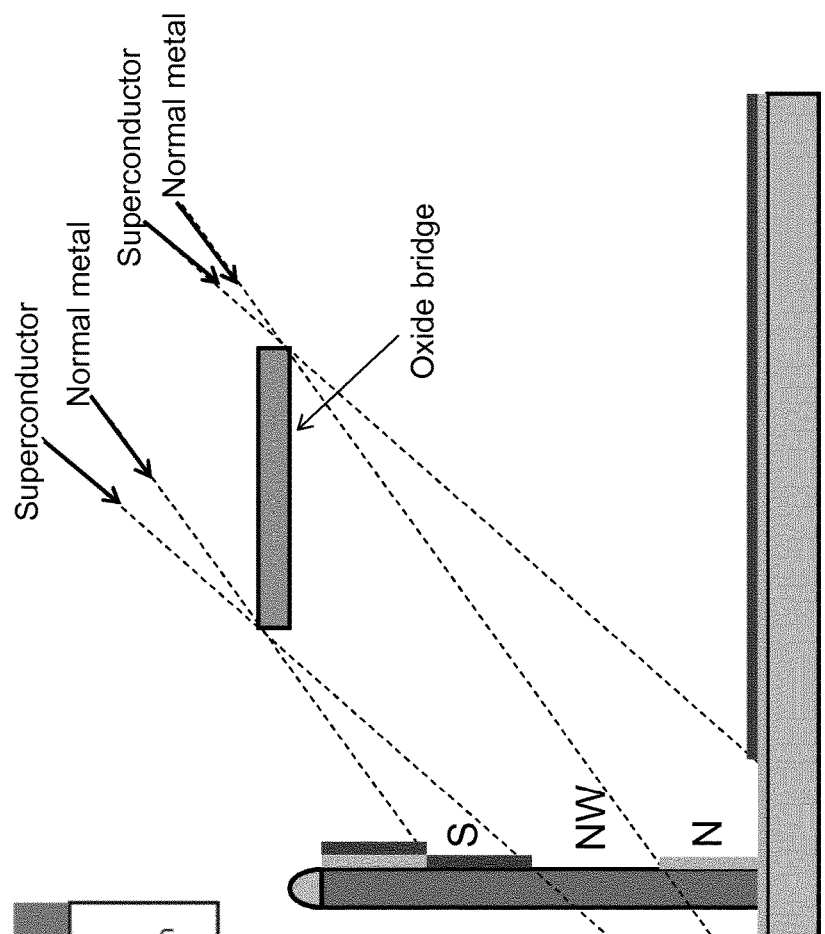

1) The starting point is an epi-ready commercial InAs wafer (FIG. 1A)
2) Using lithography, standard evaporation, and lift-off techniques, strips of oxides is made on the surface (FIG. 1A). The figure illustrates the simplest case, however, different geometries can be chosen, depending on the purpose. The patterns can also be provided by other processing techniques, such as wet etch or dry etch, e.g. reactive-ion etch (RIE).
3) Lithography is used to define etch-windows, and the InAs substrate is etched in an aqueous solution of citric acid, phosphoric acid and hydrogenperoxide which is a well-known etchant for InAs that does not etch the SiO bridges. The final structure is a trench with SiO bridges. (FIG. 1B)
4) Catalyst particles are placed at the positions of growth (FIG. 1C) and the nanowires are grown using well known growth recipes. Alternatively, a random growth can be performed.
5) After growth, epitaxial metal/superconductor is deposited in situ without breaking vacuum. FIG. 1D a shows an example of a S-NW-S segmented hybrid and FIG. 2C illustrates double angle deposition leading to an S-NW-N segmented hybrid.

Many of illustrations shown herein show just single cases. However, the principle disclosed herein can be repeated on the same substrate for wafer-scale production with FIGS. 3A-B showing an actual example.

Figure 4C:
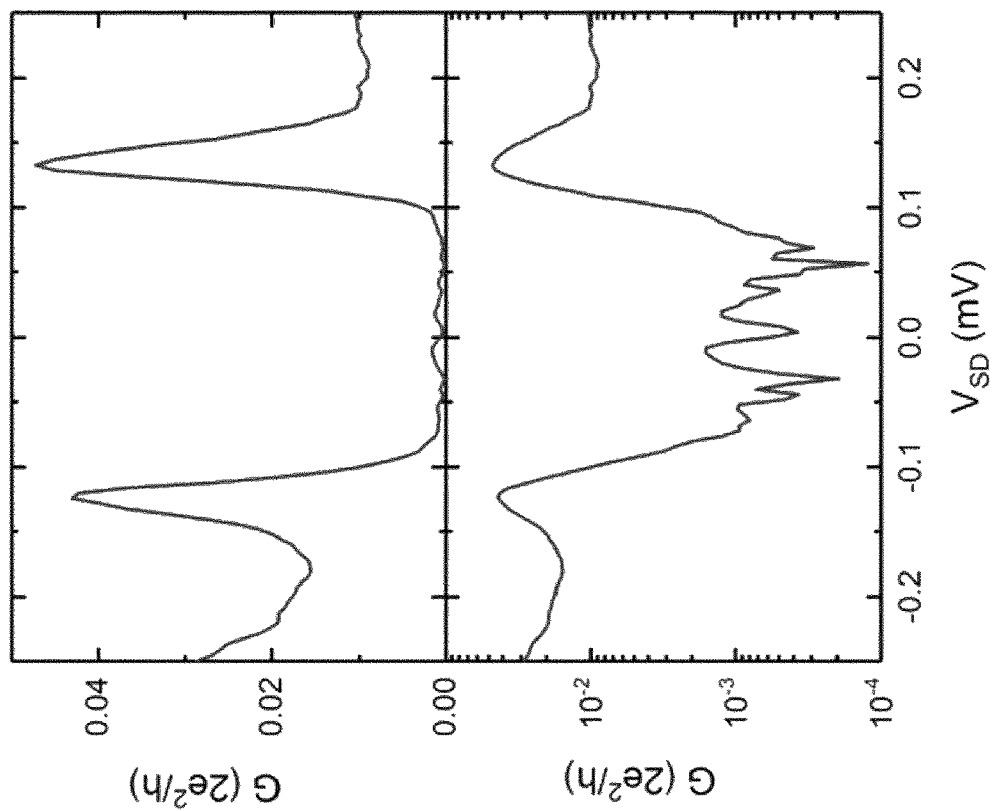
FIGS. 4A-C illustrates a confirmation of the existence of a hard induced gap in hybrid nanostructures fabricated using the presently disclosed approach.
Figure 4A:
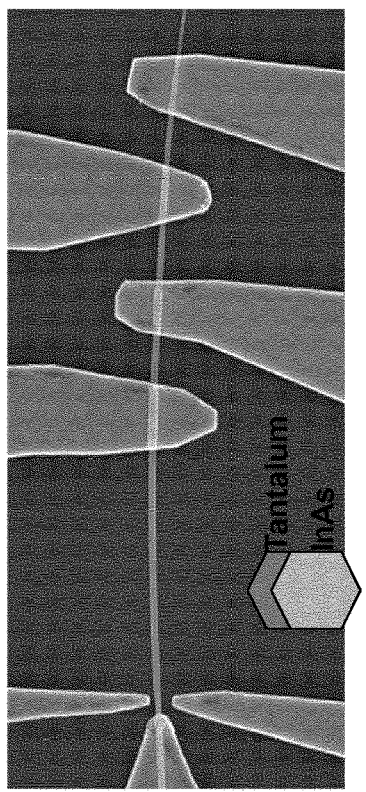
Figure 4B:
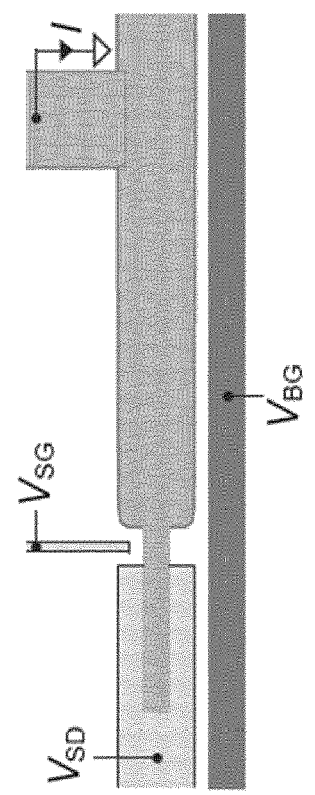

The confirmation that these structures preserve the crucial quality of hard induced superconducting gap is shown in FIG. 4. The measurement scheme is identical to that of previous demonstrations of a hard gap in InAs/Aluminum hybrids (Chang, et al, Nature Nanotechnology 10, 232 (2015)).

Items

The present disclosure will in the following be further described by means of the following items.

1. A method for manufacturing a substrate for growth of crystalline nanostructures, the method comprising the steps of:
    depositing one or more layers of a crystal growth compatible material, such as silicon oxide, in a predefined pattern on the surface of a crystal growth compatible substrate to create a predefined pattern of said crystal growth compatible material, and
    selectively etching the substrate surface around said pattern to provide at least one trench in the substrate surface which is at least partly suspended by at least a part of said pattern, the suspended part(s) of the pattern thereby creating one or more shadow structures which is vertically offset from the corresponding trench surface,
    or
    depositing additional layers of said crystal growth compatible material to create one or more shadow structures arising from the substrate surface, each shadow structure having an upper surface which is vertically offset, preferably by at least 1 µm, from the surface of the substrate.
2. The method according to any of the preceding items, wherein a suspended part of the pattern forms a bridge across the corresponding trench.
3. The method according to any of the preceding items, wherein a suspended part of the pattern forms a plurality of bridges across the corresponding trench, such as two, three, four or more bridges.
4. The method according to any of the preceding items, further comprising the step of defining a nanostructure pattern for defining a growth pattern for one or more planar crystalline nanostructures.
5. The method according to any of the preceding items, wherein at least a part of said planar nanostructure growth pattern is located in a trench and extends directly below a shadow structure, which is vertically offset from the corresponding trench surface.
6. The method according to any of the preceding items, wherein the shadow structure corresponding to at least one trench is rotationally symmetric in the plane of the substrate.

7. The method according to any of the preceding items, wherein at least a part of said shadow structure(s) is provided in a material and a configuration that is transparent to optical lithography and/or electron lithography, such as silicon oxide and/or silicon nitride.
8. The method according to any of the preceding items, wherein a longitudinal orientation of at least one shadow structure in the plane of the substrate is non-parallel to a longitudinal orientation of a corresponding planar nanostructure, such as substantially perpendicular.
9. The method according to any of the preceding items, wherein the pattern(s) is defined by means of lithography, such as optical lithography or e-beam lithography.
10. A substrate for growth of crystalline nanostructures manufactured according to the method of any of items 1-9.
11. A method for patterned deposition of material on nanostructures, the method comprising the steps of
    providing a growth substrate having at least one shadow structure, wherein at least a part of said shadow structure(s) is vertically offset from a growth surface on the growth substrate,
    growing at least one nanostructure on the growth substrate in the vicinity of at least one of said shadow structure(s) and such that at least initially the growth plane of the nanostructure(s) is vertically offset from at least a part of the shadow structure, and
    depositing at least a first layer of material on at least a part of the nanostructure(s) by means of at least a first deposition source,
    wherein the deposition source, the shadow structure(s) and the nanostructure(s) are arranged such that, during deposition of said first layer(s), at least a part the shadow structure(s) forms at least one shadow mask on the nanostructure(s) relative to the deposition source.
12. The method according to any of preceding items 11, further comprising the step of depositing at least a second layer of material on at least a part of the nanostructure(s) by means of at least a second deposition source, wherein the second deposition source, the shadow structure(s) and the nanostructure(s) are arranged such that, during deposition of said second layer(s), at least a part the shadow structure(s) forms at least one shadow mask on the nanostructure(s) relative to the second deposition source.
13. The method according to any of preceding items 12, wherein the material of the second layer is different from the material of the first layer.
14. The method according to any of the preceding items, wherein the substrate is rotated in a plane defined by the substrate during deposition of the first and/or the at least second layer of material, such as rotated at least 180 degrees or 360 degrees.
15. The method according to any of the preceding items, wherein the shadow structure corresponding to a nanostructure is rotationally symmetric in the plane of the substrate such that the same shadow mask is formed on the nanostructure if the substrate is rotated in the plane of the substrate during deposition of the first and/or the at least second layer of material.
16. The method according to any of the preceding items, wherein a nanostructure is located in correspondence with one or more shadow structures such that a first predefined shadow mask is formed on one side of the nanostructure during deposition from a first angle, and that a second predefined shadow mask is formed on a second side of the nanostructure, opposite from the first side, during deposition from a second angle.
17. The method according to any of preceding items 11-13, wherein the first layer and/or the second layer is selected from the group of semiconductors, superconductors, metals, magnetic materials, oxides and dielectrics.
18. The method according to any of preceding items 11-17, wherein the nanostructures are elongated nanostructures, such as substantially one-dimensional nanostructures, and/or elongated crystalline nanostructures.
19. The method according to any of preceding items 11-18, wherein the nanostructures are provided by bottom-up growth and selected from the group of nanowires (crystals) or nanowhiskers (crystal) or nanorods (crystals).
20. The method according to any of preceding items 11-19, wherein the nanostructures comprise a plurality of substantially plane side facets.
21. The method according to any of preceding items 11-20, wherein the growth positions of nanostructures on the substrate are determined by means of one or more catalyst patterns, such as defined on the surface of the substrate, preferably by means of lithography.
22. The method according to any of preceding items 11-21, wherein the growth positions of nanostructures on the substrate are substantially randomly determined.
23. The method according to any of preceding items 11-22, further comprising the step of kinking the growth direction of at least a part of the nanostructure(s) during growth of said nanostructure(s).
24. The method according to any of preceding items 11-23, wherein the nanostructure(s) are planar structures provided by planar growth in a plane substantially parallel to the substrate surface.
25. The method according to any of preceding items 24, wherein the planar nanostructures are grown by means of diffusive growth.
26. The method according to any of preceding items 24-25, wherein at least one planar nanostructure is grown such that at least a part of said planar nanostructure is located directly vertically below a shadow structure.
27. The method according to any of the preceding items, wherein the deposition of said at least first and/or second layer of material is provided by means of non-diffusive growth.
28. The method according to any of preceding items 11-27, wherein the growth substrate having at least one shadow structure is provided ex-situ and wherein the nanostructure growth and the layer deposition is provided in-situ.
29. The method according to any of preceding items 11-28, wherein at least a part of the method are performed under vacuum, preferably ultra high vacuum, for example in one or more vacuum chambers, and wherein the steps of growing at least one nanostructure and depositing the first layer and optionally the second layer are performed without breaking the vacuum.
30. The method according to any of preceding items 11-29, wherein the first and/or second deposition source is a vapor deposition source, and wherein the vacuum chamber and the deposition source(s) are configured to provide a directional beam flux from the deposition source(s) during deposition.

31. The method according to any of preceding items 11-30, wherein the deposited layer(s) is a metal and/or a material that becomes superconducting below a critical temperature, such as a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W or a superconductor selected from the group of high temperature ceramic superconductors, such as copper oxide and cuprate superconductors, or a superconductor selected from the group of superconducting alloys, such as NbN, NbTiN, NiGe, NbSn and $MgB_2$.

32. The method according to any of preceding items 11-31, wherein the nanostructure is provided in a semiconducting material, such as a semiconducting material selected from the group of III-V combinations, such as InAs, InP, InSb, GaAs, GaSb, AlSb and InGaAs, or group IV elements such as Si or Ge, or II-VI combinations such as ZnO, ZnSe and CdSe, or I-VII combinations.

33. The method according to any of preceding items 11-32, comprising the step of covering substantial the entirety of said at least one nanostructure with at least one final layer, a final layer such as an oxide coating.

34. The method according to any of preceding items 11-33, wherein the substrate is provided according to the method of any of items 1-9

35. A nanoscale device manufactured according to any of items 11-34.

36. A nanoscale device manufactured according to any of items 11-34, comprising an at least one exposed segment of the nanostructure and at least one segment which is covered by at least one deposited layer.

37. A nanoscale junction manufactured according to any of items 11-34, wherein the junction is formed by metal1-exposed nanostructure-metal2, wherein metal1 is a different material than metal2.

38. A nanoscale junction manufactured according to any of items 11-34, wherein the junction comprises a tunnel barrier/Josephson junction of superconductor-exposed nanostructure - superconductor.

39. A nanoscale device manufactured according to any of items 11-34, comprising one or more segments of superconducting islands wherein a superconducting island is formed by exposed nanostructure—superconductor—exposed nanostructure.

40. A nanoscale device manufactured according to any of items 11-34, wherein a junction is formed by metal—exposed nanostructure—short metal—exposed nanostructure—metal, wherein the length of the "short metal" segment is much smaller than the other metal segments.

The invention claimed is:
1. A method for patterned deposition of material on nanostructures, the method comprising:
providing a growth substrate having at least one shadow structure, wherein at least a part of said at least one shadow structure is vertically offset from the growth surface on the growth substrate,
growing at least one nanostructure on the growth surface of the growth substrate, or from the growth surface of the growth substrate, in the vicinity of said at least one shadow structure and such that at least initially the growth plane of the at least one nanostructure is vertically offset from at least a part of the at least one shadow structure, wherein an initial growth of the at least one nanostructure occurs after providing the shadow structure; and
depositing at least a first layer of material on at least a part of the at least one nanostructure by means of at least a first deposition source,
wherein the at least first deposition source, the at least one shadow structure and the at least one nanostructure are arranged such that, during deposition of said at least first layer, at least a part the at least one shadow structure forms at least one shadow mask on the at least one nanostructure relative to the deposition source.

2. The method according to claim 1, wherein the at least one shadow structure is a predefined pattern of silicon oxide and/or silicon nitride.

3. The method according to claim 1, wherein the growth of the at least one nanostructure growth and the at least a first layer deposition is provided in-situ.

4. The method according to claim 1, wherein the growth substrate comprises at least one trench and wherein at least a part of the at least one shadow structure suspends the at least one trench such that a suspending part of the at least one shadow structure is vertically offset from the corresponding trench surface and such that the at least one shadow mask is formed by the suspending part of the at least one shadow structure.

5. The method according to claim 4, wherein the at least one trench is created by selectively etching the substrate surface around a predefined pattern of silicon oxide and/or silicon nitride.

6. The method according to claim 1, further comprising the step of depositing at least a second layer of material on at least a part of the at least one nanostructure by means of at least a second deposition source, wherein the second deposition source, the at least one shadow structure and the at least one nanostructure are arranged such that, during deposition of the at least said second layer, at least a part the at least one shadow structure forms at least one shadow mask on the at least one nanostructure relative to the second deposition source.

7. The method according to claim 6, wherein the material of the second layer is different from the material of the first layer.

8. The method according to claim 1, wherein the substrate is rotated in a plane defined by the substrate during deposition of the first and/or a second layer of material.

9. The method according to claim 1, wherein the at least one shadow structure forming the at least one shadow mask on the at least one nanostructure is rotationally symmetric in the plane of the substrate such that the at least one shadow mask formed by the at least one shadow structure on the at least one nanostructure remains the same if the substrate is rotated in the plane of the substrate during deposition of the first and/or a second layer of material.

10. The method according to claim 1, wherein the at least one nanostructure is located in correspondence with the at least one shadow structure such that a first predefined shadow mask is formed on a first side of the at least one nanostructure during deposition from a first angle, and that a second predefined shadow mask is formed on a second side of the at least one nanostructure, opposite from the first side, during deposition from a second angle.

11. The method according to claim 1, wherein the at least one nanostructure is an elongated crystalline nanostructure.

12. The method according to claim 1, wherein the at least one nanostructure is provided such that the longitudinal extension of the at least one nanostructure extends vertically from the growth surface and wherein the at least one nanostructure is selected from the group consisting of nanowires, nanowhiskers, and nanorods.

13. The method according to claim 1, wherein the at least one nanostructure is a planar structure provided by planar growth in a plane substantially parallel to the growth surface.

14. The method according to claim 13, wherein the at least one planar nanostructure is grown by means of diffusive growth.

15. The method according to claim 13, wherein at least one planar nanostructure is grown such that at least a part of said at least one planar nanostructure is located directly vertically below the at least one shadow structure.

16. The method according to claim 1, wherein the deposition of said at least first and/or a second layer of material is provided by means of non-diffusive growth.

17. The method according to claim 1, wherein at least the steps of growing the at least one nanostructure and depositing the first layer, and optionally a second layer, are performed under vacuum in at least one vacuum chamber without breaking vacuum.

18. The method according to claim 1, wherein the growth substrate is provided by:

depositing one or more layers of a crystal growth compatible material in a predefined pattern on the surface of a crystal growth compatible substrate to create the predefined pattern of said crystal growth compatible material, and selectively etching the growth substrate surface around said pattern to provide at least one trench in the substrate surface that is at least partly suspended by at least a part of said pattern, the suspended part of the pattern thereby creating one or more shadow structures that is vertically offset from the corresponding trench.

* * * * *